US012671018B2

(12) United States Patent
Visokay

(10) Patent No.: US 12,671,018 B2
(45) Date of Patent: Jun. 30, 2026

(54) THERMISTOR INTEGRATED WITH A BIAS RESISTOR

(71) Applicant: TEXAS INSTRUMENTS INCORPORATED, Dallas, TX (US)

(72) Inventor: Mark Robert Visokay, Dallas, UT (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 322 days.

(21) Appl. No.: 18/343,092

(22) Filed: Jun. 28, 2023

(65) Prior Publication Data

US 2025/0006408 A1     Jan. 2, 2025

(51) Int. Cl.
| | |
|---|---|
| *H01C 7/02* | (2006.01) |
| *H01C 7/04* | (2006.01) |
| *H01C 17/24* | (2006.01) |
| *H10D 84/00* | (2025.01) |
| *G01K 7/24* | (2006.01) |

(52) U.S. Cl.
CPC ............. *H01C 7/021* (2013.01); *H01C 7/041* (2013.01); *H01C 17/2416* (2013.01); *H10D 84/204* (2025.01); *H10D 84/209* (2025.01); *G01K 7/24* (2013.01)

(58) Field of Classification Search
CPC ...... G01K 7/24; H01C 17/2416; H01C 7/021; H01C 7/041; H10D 84/204; H10D 84/209
See application file for complete search history.

(56) References Cited

U.S. PATENT DOCUMENTS

| | | | |
|---|---|---|---|
| 6,171,922 | B1 | 1/2001 | Maghsoudnia |
| 8,927,385 | B2 | 1/2015 | Nandakumar et al. |
| 9,991,120 | B2 | 6/2018 | Montgomery et al. |
| 10,663,355 | B2 | 5/2020 | Green et al. |
| 10,826,133 | B2 * | 11/2020 | White ................. H01M 50/581 |
| 11,004,929 | B2 | 5/2021 | Lee et al. |
| 11,047,746 | B2 | 6/2021 | Green et al. |
| 2017/0194417 | A1 | 7/2017 | Gruber et al. |
| 2020/0118720 | A1 * | 4/2020 | French ................. H10D 84/209 |
| 2020/0119132 | A1 * | 4/2020 | Lee ..................... H01L 23/5228 |
| 2024/0077366 | A1 * | 3/2024 | Ito ........................... H01L 22/34 |

OTHER PUBLICATIONS

Young-Cheon Kwon, et al., "Process Optimization of Integrated SiCr Thin-Film Resistor for High-Performance Analog Circuits," IEEE Transactions on Electron Devices, vol. 61, No. 1, Jan. 2014.

* cited by examiner

*Primary Examiner* — Jaehwan Oh
(74) *Attorney, Agent, or Firm* — Andrew R. Ralston; Frank D. Cimino

(57) ABSTRACT

An electronic device including a thermistor and a bias reference resistor in a voltage divider configuration integrated into a single die and a method of fabricating the same. In an example, the electronic device comprises a substrate including an n-well region, a thermistor formed in the n-well region, and a bias resistor connected in series to the thermistor, the bias resistor formed in a region of the substrate isolated from the n-well region.

20 Claims, 21 Drawing Sheets

100

100

200

$$V_{TEMP} = \frac{V_{BIAS} \times R_{TMP}}{R_{BIAS} + R_{TMP}}$$

500A

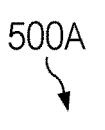

FIG. 5A

502 —
FORMING A DNWELL REGION IN A SINGLE CRYSTAL LAYER (e.g., EPI LAYER) OF A SUBSTRATE, THE DNWELL REGION FOR FORMING A THERMISTOR BODY, e.g., IN ASSOCIATION WITH ACTIVE AREA DEFINITION PATTERNING CONFIGURED TO DEFINE CONTACT POSTS OR RIDGES HAVING DIFFERENT SPACINGS IN RESPECTIVE THERMISTOR HEAD REGIONS; ANNEALING TO DRIVE AND ACTIVATE THE DOPANTS IN DNWELL

504 —
OPTIONALLY FORMING SPWELLS FOR ISOLATION OF MULTIPLE DNWELL REGIONS IF MULTI-COMPONENT/SEGMENT THERMISTOR IMPLEMENTATION IS CONTEMPLATED

506 —
PATTERNING ACTIVE AREAS AND/OR DEFINING CONTACT POSTS; FORMING STI LAYER OVER THE SUBSTRATE AND PERFORMING CMP

508 —
FORMING A POLYSILICON LAYER AND IMPLANTING WITH DOPANTS FOR SETTING RESISTANCE AND LOW/ZERO TEMPCO FUNCTIONALITY

510 —
PATTERNING AND ETCHING THE POLYSILICON LAYER TO FORM A BIAS RESISTOR STRUCTURE THAT IS LATERALLY OR VERTICALLY POSITIONED RELATIVE TO THE THERMISTOR BODY WHILE MAINTAINING ISOLATION

512 —
IMPLANTING CONTACT POSTS WITH DOPANTS IN THE HEAD REGIONS OF THE THERMISTOR WHILE BLOCKING THE POLYSILICON BIAS RESISTOR STRUCTURE, e.g., USING A PATTERNED PHOTORESIST OPERATING AS AN IMPLANT BLOCK WITH RESPECT TO THE BIAS RESISTOR STRUCTURE

514 —
ANNEALING (e.g., RTA) TO ACTIVATE THE DOPANTS IN THE THERMISTOR CONTACT POSTS AND THE POLYSILICON BIAS RESISTOR STRUCTURE

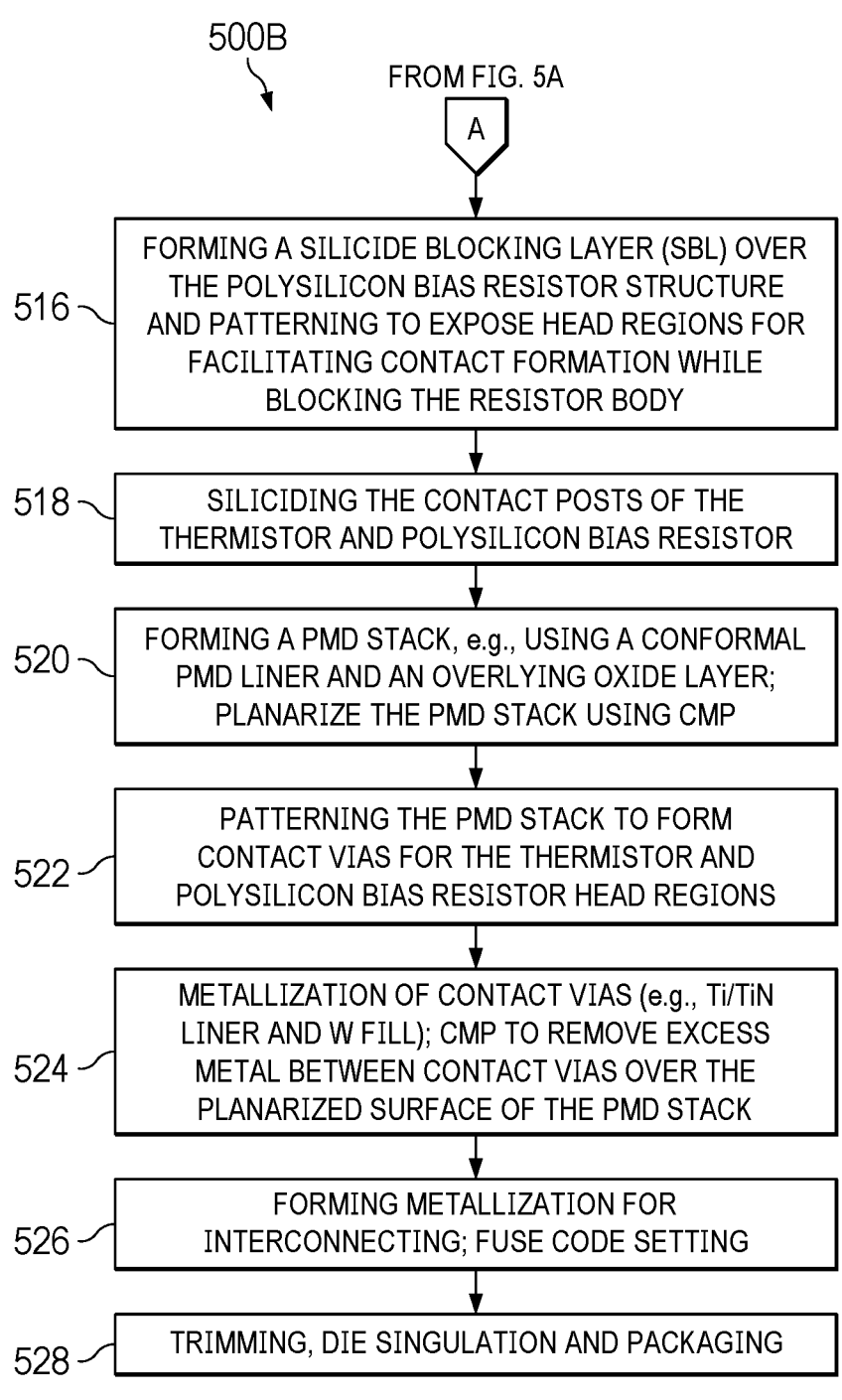

500B

FROM FIG. 5A

A

516 — FORMING A SILICIDE BLOCKING LAYER (SBL) OVER THE POLYSILICON BIAS RESISTOR STRUCTURE AND PATTERNING TO EXPOSE HEAD REGIONS FOR FACILITATING CONTACT FORMATION WHILE BLOCKING THE RESISTOR BODY

518 — SILICIDING THE CONTACT POSTS OF THE THERMISTOR AND POLYSILICON BIAS RESISTOR

520 — FORMING A PMD STACK, e.g., USING A CONFORMAL PMD LINER AND AN OVERLYING OXIDE LAYER; PLANARIZE THE PMD STACK USING CMP

522 — PATTERNING THE PMD STACK TO FORM CONTACT VIAS FOR THE THERMISTOR AND POLYSILICON BIAS RESISTOR HEAD REGIONS

524 — METALLIZATION OF CONTACT VIAS (e.g., Ti/TiN LINER AND W FILL); CMP TO REMOVE EXCESS METAL BETWEEN CONTACT VIAS OVER THE PLANARIZED SURFACE OF THE PMD STACK

526 — FORMING METALLIZATION FOR INTERCONNECTING; FUSE CODE SETTING

528 — TRIMMING, DIE SINGULATION AND PACKAGING

FIG. 5B

THERMISTOR INTEGRATED WITH A BIAS RESISTOR

FIELD OF THE DISCLOSURE

Disclosed implementations relate generally to the field of semiconductor devices and fabrication. More particularly, but not exclusively, the disclosed implementations relate to an IC device having an integrated thermistor and a bias resistor in a voltage divider configuration.

BACKGROUND

Thermistors are temperature sensing components that have resistance configured to change with temperature, e.g., having a high temperature coefficient of resistance (TCR) over a suitable range. Thermistors are sometimes used in voltage divider circuits with a bias reference resistor that does not change the resistance (or changes very little) with respect to temperature in an operational range, thereby exhibiting a low or zero TCR. Thermistors and reference resistors are often fabricated as blocks of ceramic material or blocks of silicon that are provided as separate, discrete components on a circuit board, thereby requiring additional space for purchase and mounting of two separate products.

SUMMARY

The following presents a simplified summary in order to provide a basic understanding of some examples of the present disclosure. This summary is not an extensive overview of the examples, and is neither intended to identify key or critical elements of the examples, nor to delineate the scope thereof. Rather, the primary purpose of the summary is to present some concepts of the present disclosure in a simplified form as a prelude to a more detailed description that is presented in subsequent sections further below.

In one example, an electronic device including a thermistor and a bias reference resistor in a voltage divider configuration integrated into a single semiconductor die is disclosed. In a representative implementation, the electronic device may comprise a substrate including an n-well region, a thermistor formed in the n-well region, and a bias reference resistor connected in series to the thermistor, wherein the bias reference resistor is formed in a region of the substrate isolated from the n-well region, e.g., either laterally, horizontally, and/or vertically. In one arrangement, the thermistor may comprise a well resistor in the n-well region doped with appropriate dopants for providing a high TCR. In one arrangement, the bias reference resistor may comprise a polysilicon resistor doped with boron to provide a low or zero TCR. In one arrangement, the series-coupled thermistor and bias reference resistor may be disposed between a first reference voltage rail and a second reference voltage rail. In another example, a method of fabricating an integrated thermistor and a bias reference resistor in the same process flow is disclosed, wherein the thermistor and/or the bias reference resistor may be independently tuned to achieve appropriate respective target resistances.

BRIEF DESCRIPTION OF THE DRAWINGS

Implementations of the present disclosure are illustrated by way of example, and not by way of limitation, in the Figures of the accompanying drawings. It should be noted that different references to "an" or "one" implementation in this disclosure are not necessarily to the same implementation, and such references may mean at least one. Further, when a particular feature, structure, or characteristic is described in connection with an implementation, it is submitted that it is within the knowledge of one skilled in the art to effect such feature, structure, or characteristic in connection with other implementations whether or not explicitly described.

The accompanying drawings are incorporated into and form a part of the specification to illustrate one or more example implementations of the present disclosure. Various advantages and features of the disclosure will be understood from the following Detailed Description taken in connection with the appended claims and with reference to the attached drawing Figures in which:

FIGS. 5A and 5B depict a flowchart of a method of fabricating an electronic device comprising an integrated thermistor with a bias resistor according to some examples of the present disclosure.

DETAILED DESCRIPTION

Figure 1:
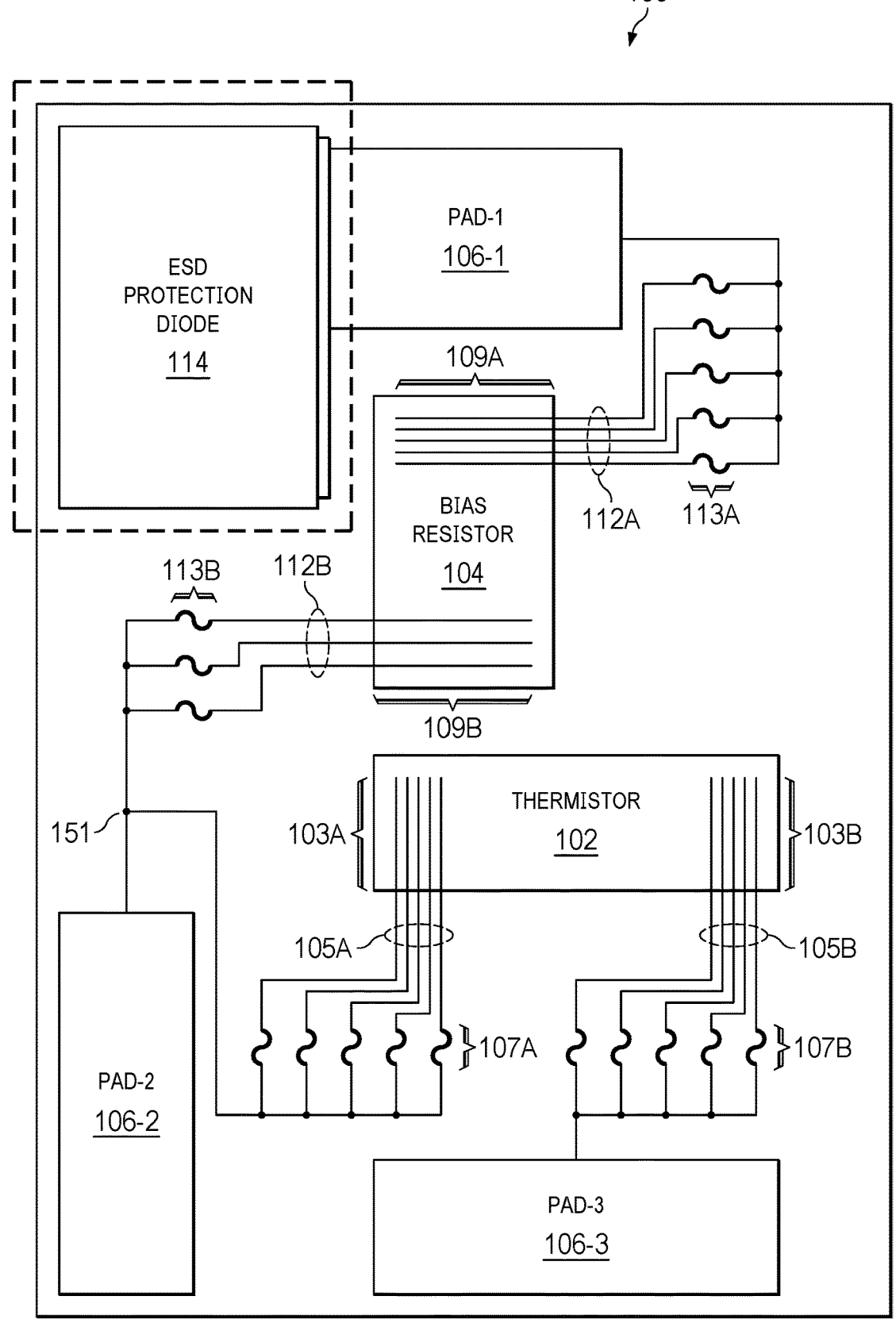
FIG. 1 depicts the layout of an electronic device including a thermistor integrated with a bias resistor according to some examples.

Examples of the disclosure are described with reference to the attached Figures wherein like reference numerals are generally utilized to refer to like elements. The Figures are not drawn to scale and they are provided merely to illustrate examples. Numerous specific details, relationships, and methods are set forth below to provide an understanding of one or more examples. However, it should be understood that some examples may be practiced without such specific details. In other instances, well-known subsystems, components, structures and techniques have not been shown in detail in order not to obscure the understanding of the examples. Accordingly, it will be appreciated by one skilled in the art that the examples of the present disclosure may be practiced without such specific components.

Additionally, terms such as "coupled" and "connected," along with their derivatives, may be used in the following description, claims, or both. It should be understood that these terms are not necessarily intended as synonyms for each other. "Coupled" may be used to indicate that two or more elements, which may or may not be in direct physical or electrical contact with each other, co-operate or interact with each other. "Connected" may be used to indicate the establishment of communication, i.e., a communicative relationship, between two or more elements that are coupled with each other. "Directly connected" may be used to convey that two or more physical features touch, or share an interface between each other.

Various examples are directed to integration of a reference resistor and a thermistor over a same semiconductor substrate, or die. Such integration has been elusive until now, due at least to the disparate materials needed for the resistor and thermistor, and their different processing requirements, e.g. conflicting thermal budget limits. While such examples provide materials and processes that advantageously allow such integration, no particular result is a requirement unless explicitly recited in a particular claim.

FIG. 1 depicts an electronic device 100, also referred to herein as an integrated circuit (IC) device, including a thermistor 102 coupled to a bias resistor 104 in a voltage divider arrangement, wherein the thermistor 102 and the bias resistor 104 may be integrated in a single semiconductor die according to an example process flow set forth further below in detail. In one implementation, the electronic device 100 may comprise a 3-terminal die, e.g., having pads 106-1 to 106-3, wherein an electrostatic discharge (ESD) protection diode 114 may be optionally provided in association with a pad, e.g., pad 106-1. Depending on implementation, the electronic device 100 may have a die size, e.g., approximately 300 μm by 500 μm, without limitation. Whereas the bias resistor 104, also referred to as a reference resistor, and the thermistor 102 are shown in this Figure as having generally rectangular shapes, respectively, each with corresponding length and width dimensions, the electronic device 100 may comprise a reference/bias resistor and a thermistor having other shapes integrated into a voltage divider circuit formed on a single die in additional and/or alternative arrangements. Further, the thermistor 102 and the bias resistor 104 may each comprise a multi-segment component in some additional and/or alternative arrangements. Regardless of implementation, the thermistor 102 is operable as a "high" TCR component and the bias resistor 104 is operable as a "low" or zero TCR component, wherein according to the illustrated examples each component may be independently and individually trimmed (e.g., in fine-tuning and/or coarse tuning operations) in an integrated voltage divider configuration that may be deployed in a variety of applications.

In one arrangement, the thermistor 102 may comprise a high TCR component having a positive coefficient of resistance around 6000 ppm/° C. with a 0.2% tolerance across a suitable temperature range, −40° C. to +150° C., for example, where a nominal resistance of around 10 kΩ at room temperature (~25° C.) may be provided by appropriate doping (and trimming, if necessary) during fabrication as will be set forth below. In one arrangement, the bias resistor 104 may comprise a low TCR component having a coefficient of resistance within a range of ±100 ppm/° C., with a same resistance as the nominal resistance of the thermistor 102, e.g., 10 kΩ at room temperature, which may be achieved in the same fabrication flow using a separate doping process (and trimming, if necessary) with respect to forming a polysilicon resistor body. In an example implementation where the thermistor 102 and bias resistor 104 may each comprise a resistive component having a target resistance of 10 kΩ at room temperature, the resistive components may be fabricated as rectangular structures having a width of about 20-25 μm and a length of about 65-75 μm, although other dimensions, sizes, shapes or form factors may be used in additional and/or alternative arrangements without limitation. Further, the thermistor 102 and bias resistor 104 may be oriented relative to each other and/or to an orientation of the electronic device 100 in a variety of configurations.

In an example implementation, the tunable thermistor 102 may be provided with a first terminal region 103A having a first plurality of contact lines 105A, each having a respective one of fuse links 107A, e.g., disposed in a fuse bank, for facilitating selective coupling with a pad, e.g., pad 106-2. Likewise, a second terminal region 103B of the tunable thermistor 102 may also be provided with a second plurality of contact lines 105B that each have a respective one of fuse links 107B, e.g., disposed in a fuse bank, for facilitating selective coupling with another pad, e.g., pad 106-3. In some arrangements, the first plurality of contact lines 105A and second plurality of contact lines 105B may comprise a same number of lines although it is not a requirement. Further, in some arrangements, either the first terminal region 103A or second terminal region 103B may comprise only a single contact line operable to be connected to a respective pad, e.g., without a fuse link disposed therebetween. As will be seen further below, the individual contact lines of respective pluralities of contact lines 105A and/or 105B may be positioned apart from each other with predetermined spacings disposed therebetween during fabrication in order to facilitate a potentiometer-like resistance ladder sequence between the terminal regions 103A/103B of the thermistor 102. In some arrangements, the resistance ladder sequence associated with the thermistor 102 may be trimmed at either terminal region 103A/103B for effectuating fine- and/or coarse-tuning operations with respect to setting and/or achieving a target resistance value of the thermistor 102 by selectively enabling and disabling appropriate fuse links relative to respective terminal regions 103A/103B.

In the illustrated example of FIG. 1, the contact lines 105A are relatively closely spaced and the contact lines 105B are relatively widely spaced. Each contact line of the respective grouping may be connected to a first or a second pad, e.g., pad 106-2 and pad 106-3, via a corresponding fuse of the fuse links 107A and 107B. The overall resistance provided by the thermistor 102 may be adjusted, or "trimmed," by selectively severing the connection of a subset of the contact lines to the corresponding pads 106-2/106-3, for example by opening, or "blowing," a subset of the fuses of respective fuse links 107A, 107B, while keeping only one fuse line in a closed state. Accordingly, thermistor 102 is operable as a potentiometer, as the effective length of thermistor 102 is modulated by the trimming process due to the additive property of the extra segments of resistance at the terminal regions added to the main resistor body. It should be appreciated that the trim increment is greater for the contact lines with wider spacings, and smaller for the relatively closer connection lines. Consequently, the more widely spaced contact lines provide a coarse trim or tuning and the more narrowly spaced contact lines provide a fine trim or tuning. In some arrangements, an objective of the trimming process may include establishing a resistance of the thermistor 102 that is close to a predetermined value, e.g., a design value that is in accordance with an integrated voltage divider application, wherein a bias resistor, e.g., bias resistor 104, is formed in the same fabrication flow and integrated with the thermistor 102 on the same die, where the bias resistor is also independently tunable similar to the thermistor 102.

In the example integrated thermistor-resistor configuration shown in FIG. 1, the bias resistor 104 having terminal regions 109A and 109B is operable to be connected in series with the thermistor 102 via a common node 151 coupled to a pad, e.g., pad 106-2. Similar to the contact line arrangement set forth above with respect to the thermistor 102, the bias resistor 104 may also be provided with two sets of contact lines 112A, 112B, at terminal regions 109A, 109B, respectively. Further, each contact line grouping 112A/112B associated with the bias resistor 104 may be provided with a corresponding set of fuse links 113A/113B, similar to the fuse link arrangement associated with the thermistor 102, for selective coupling of terminal regions 109A/109B to corresponding pads, e.g., pads 106-1 and 106-2. Additionally, each set of the contact lines 112A and 112B may be provided with different spacings between two adjacent contact lines so as to facilitate coarse- or fine-tuning operations subsequent to fabricating a resistor body of the bias resistor 104, e.g., in a manner similar to the trimming operations set forth above with respect to the thermistor 102. By selectively opening all but one of the fuse links 113A, the terminal region 109A having a corresponding resistance segment may be disposed in an electrically conductive relationship with pad 106-1. Likewise, by selectively opening all but one of the fuse links 113B, the terminal region 109B having a corresponding resistance segment may be electrically connected to pad 106-2 as well as the terminal region 103A of the thermistor 102 via node 151.

Figure 2:
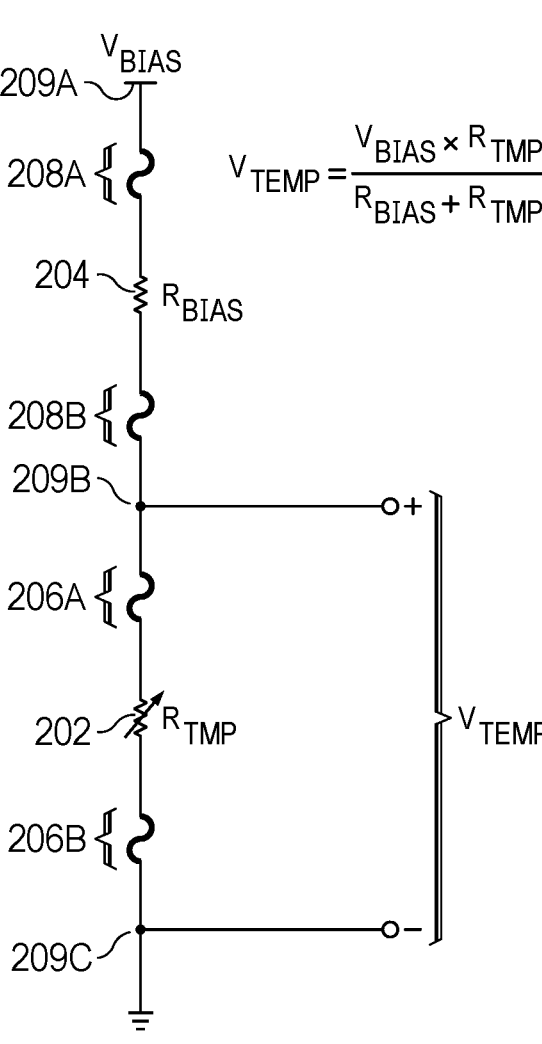
FIG. 2 depicts a circuit schematic of a voltage divider corresponding to the electronic device of FIG. 1 according to some examples.

FIG. 2 depicts an example voltage divider 200 in a circuit schematic representation that generally corresponds to the integrated thermistor-resistor arrangement of the electronic device shown in FIG. 1, wherein a bias resistor ($R_{Bias}$) 204 and a thermistor ($R_{TMP}$) 202 are connected in series having a common node 209B disposed between a first reference voltage rail 209A, e.g., a $V_{Bias}$ rail, and a second reference voltage rail 209C, e.g., ground. Fuse links or banks 208A and 208B are operably connected to respective terminals of $R_{Bias}$ 204 for facilitating resistance trimming operations as set forth above. Likewise, fuse links or banks 206A and 206B are operably connected to respective terminals of $R_{TMP}$ 202 for facilitating resistance trimming operations associated therewith. In operation, an output voltage $V_{TEMP}$ may be obtained as a fraction of $V_{Bias}$, e.g., multiplied by the resistance ratio $\{R_{TMP}/[R_{Bias}+R_{TMP}]\}$.

Figure 3A:
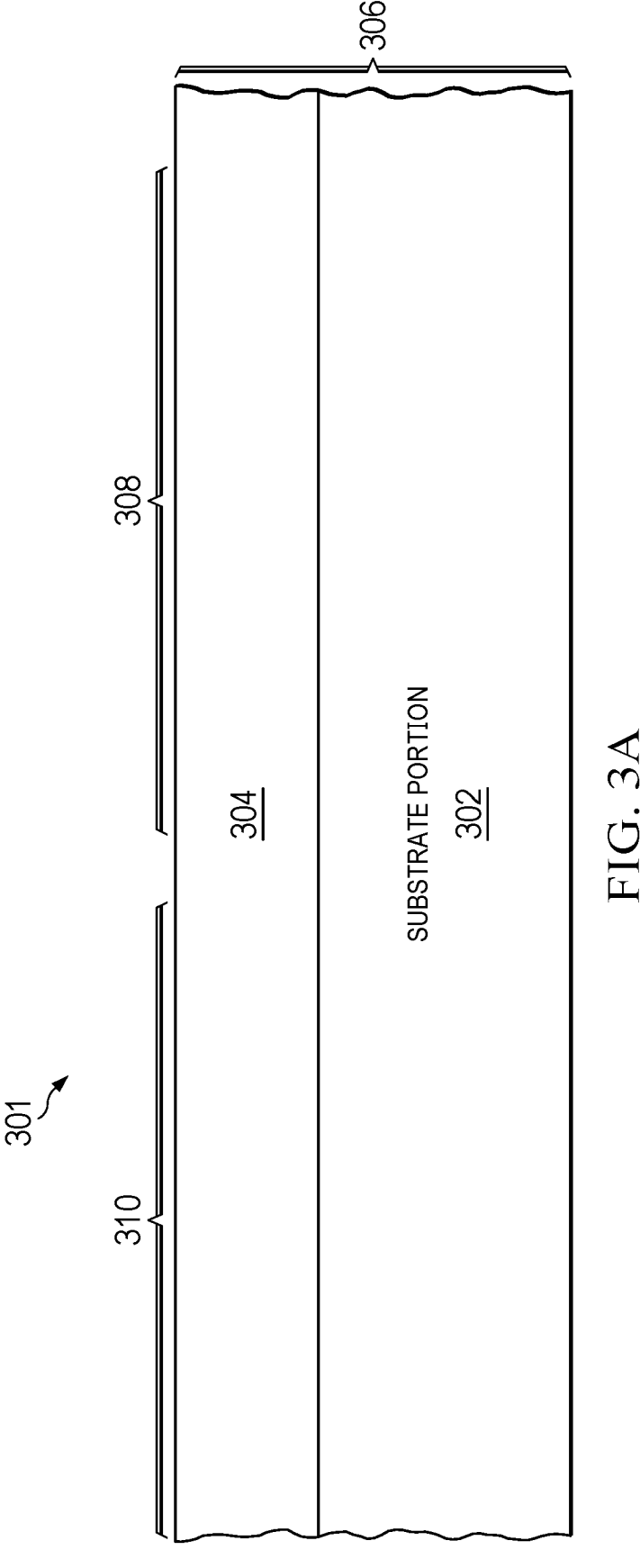
FIGS. 3A-3N depict cross-sectional views of a partially formed semiconductor device at various stages of fabrication for fabricating a thermistor coupled with a bias resistor in an integrated process flow according to some examples.

In an example implementation, thermistor 102/202 may be formed as a well resistor in an n-well region of a suitable semiconductor substrate and bias resistor 104/204 may be formed as a doped polysilicon resistor disposed in a region of the substrate isolated from the n-well region. FIGS. 3A-3N depict cross-sectional views of a partially formed semiconductor device at various stages of fabrication for fabricating a thermistor coupled with a bias resistor in an integrated process flow according to some examples. FIGS. 5A and 5B each depict a portion 500A, 500B, respectively, of a flowchart of a fabrication method that summarizes various steps roughly corresponding to the fabrication stages shown in FIGS. 3A-3N. Taking reference to FIGS. 3A-3N and 5A/5B together, an integrated process flow will be set forth in accordance with a representative implementation.

In FIG. 3A, a semiconductor device, or integrated circuit (IC), 301 is shown at an early fabrication stage, wherein a p-type substrate portion 302 and a lightly doped p-type single-crystal silicon layer 304 (e.g., epitaxially grown or formed) over the p-type substrate portion 302 may form a portion of a die formed in a semiconductor process wafer (e.g., a silicon wafer). For purposes herein, the p-type substrate portion 302 and the p-type single-crystal silicon layer 304 may be cumulatively treated as substrate 306 wherein a thermistor region 308 and a reference or bias resistor region 310 may be provided for facilitating the fabrication of two separate resistive components, e.g., a high TCR component and a low/zero TCR component, respectively, without diminishing (or reactivating) respective dopants' activation or performance in the course of various thermal processes.

Figure 3B:
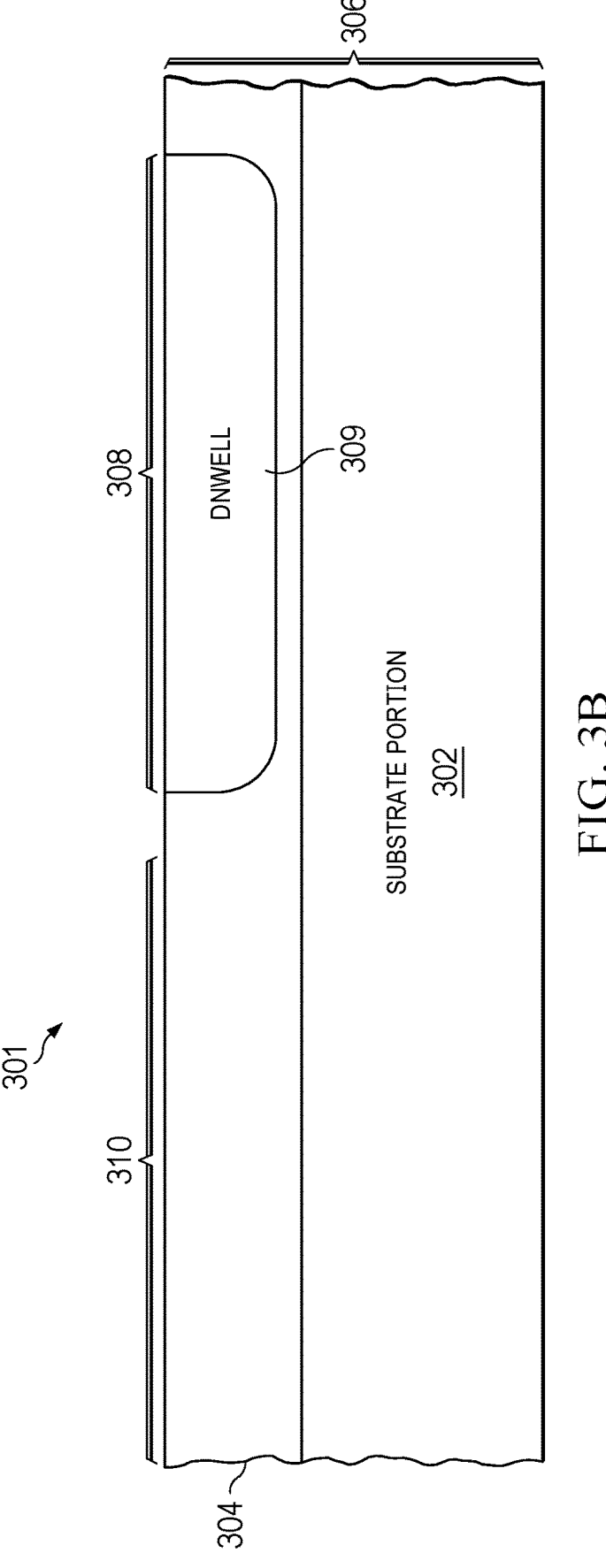

In FIG. 3B, and at block 502 of the method 500A/500B, a fabrication stage is set forth wherein a deep n-well (DNWELL) 309, sometimes referred to as a thermistor body 309, is formed in the thermistor region 308 of the single-crystal layer 304. Depending on the process flow, DNWELL 309 may be formed prior to or after an active area definition process (e.g., referred to as a MOAT process in some foundries) configured to pattern an active area of the die, which may include defining contact posts, strips or ridges having different spaces therebetween for tuning a thermistor body as will be set forth in detail further below. In the example shown in FIG. 3B, DNWELL patterning and implant is performed before MOAT patterning and forming associated field isolation regions. In one example implementation, DNWELL 309 may be doped with phosphorus or arsenic. For example phosphorous may be implanted with a dose of about $2.0 \times 10^{12}/cm^2$ (implant energy of about 2 MeV) and arsenic having a dose of about $3.0 \times 10^{12}/cm^2$ (implant energy of about 160 keV), to achieve a junction depth of about 2.5 μm in the single-crystal layer 304. In some additional examples, an annealing step may be performed (not specifically shown in the Figures) to drive and/or activate the dopants, which can take place prior to forming dielectric isolation regions, e.g., by a shallow trench isolation (STI) or a local oxidation of silicon (LOCOS) in some examples. In some additional, alternative and/or optional examples, shallow p-well (SPWELL) regions may be formed for isolating multiple DNWELL regions that may be provided for supporting a multi-component/segment thermistor structure (not specifically shown in the cross-sectional views), wherein the SPWELL regions may be formed using any known or heretofore unknown shallow p-well formation processes, as shown in block 504 that may be provided optionally. Additional details relating to forming multi-segmented thermistors according to some examples may be found in U.S. Patent Application Publication No. 2020/0119132, which is incorporated by reference herein in its entirety for all purposes.

It will be appreciated, however, that an SPWELL-based isolation may be optionally provided even in a single-segment thermistor application in some process flows although that may involve an additional masking step, thereby potentially increasing the production cost. Regardless of whether multi-segment or single-segment thermistor application is implemented, if an SPWELL isolation is provided, the DNWELL anneal process is implemented before the SPWELL formation, wherein the anneal process may be performed at around 1150° C. for about 4 to 5 hours or so. Skilled artisans will recognize upon reference hereto that a DNWELL region, e.g., DNWELL 309 having appropriate dopants, may be suitably annealed in order to provide appropriate junction profile(s) for supporting a resistor body operative as a thermistor with a target resistance, which may be tuned according to the examples herein.

Figure 3C:
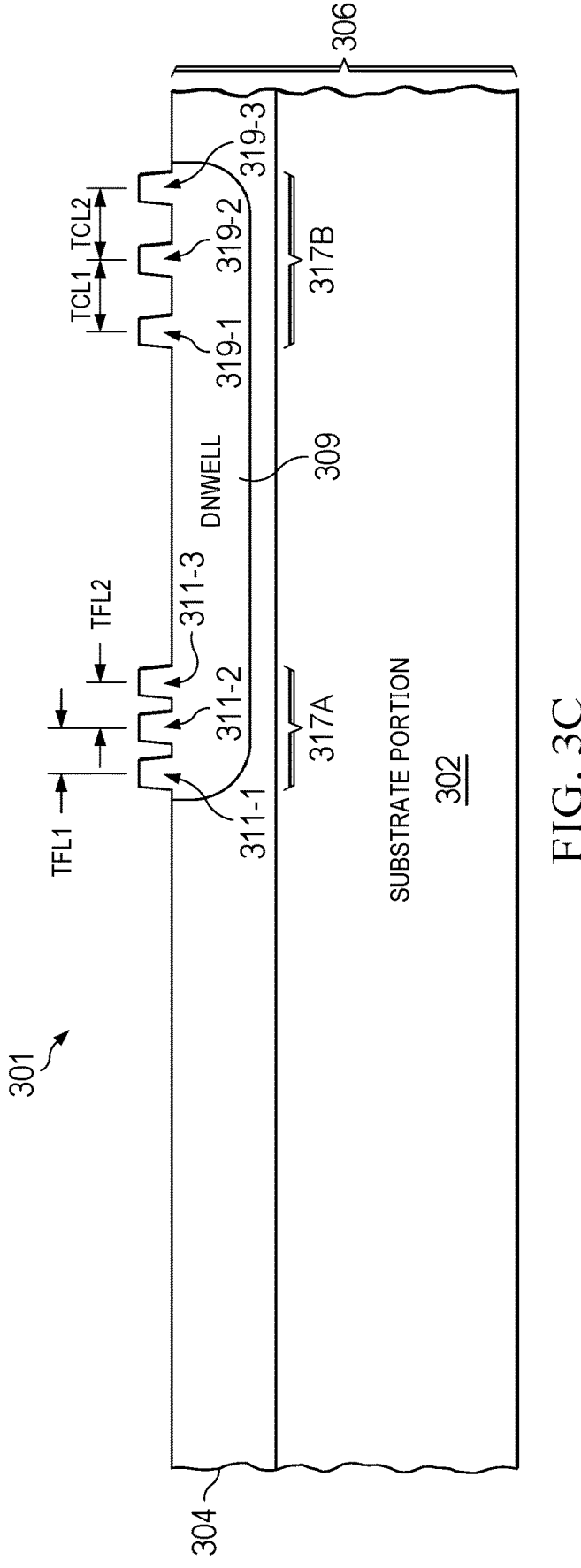

In FIG. 3C, and at block 506, a fabrication stage is set forth wherein the semiconductor device 301 is patterned for active area definition (e.g., MOAT pattern) wherein suitable contact posts or ridges may be formed at respective resistor head regions 317A, 317B associated with the thermistor body formed in the DNWELL 309. As illustrated, a first set of contact posts (which appear as rectangular strips or ridges in a top plan view), e.g., contact posts 311-1 to 311-3, may be formed in head region 317A, wherein the contact posts may be provided with a narrow spacing, or a first pitch, therebetween (e.g., as illustrated by thermistor fine tuning line (TFL) 1 and TFL 2). In similar fashion, a second set of contact posts, e.g., contact posts 319-1 through 319-3, may be formed in head region 317B to have a wider spacing therebetween, or a second pitch (e.g., as illustrated by thermistor coarse tuning line (TCL) 1 and TCL 2). It should be appreciated that various pitch sizes may be provided within a single head region and/or between the two head regions, which may be configured to effectuate multiple combinations of fine-tuning and/or coarse-tuning resistance segments in predetermined increments of thermistor resistance upon fabrication of the semiconductor device 301. Further, the contact posts 319-1 to 319-3 and 311-1 to 311-3 in the head regions 317B and 317A, respectively, may be implanted by an additional n-type dopant in an implant process that may be selectively blocked in order to integrate the fabrication of a poly-based bias resistor in the same flow as will be set forth further below.

Figure 3D:
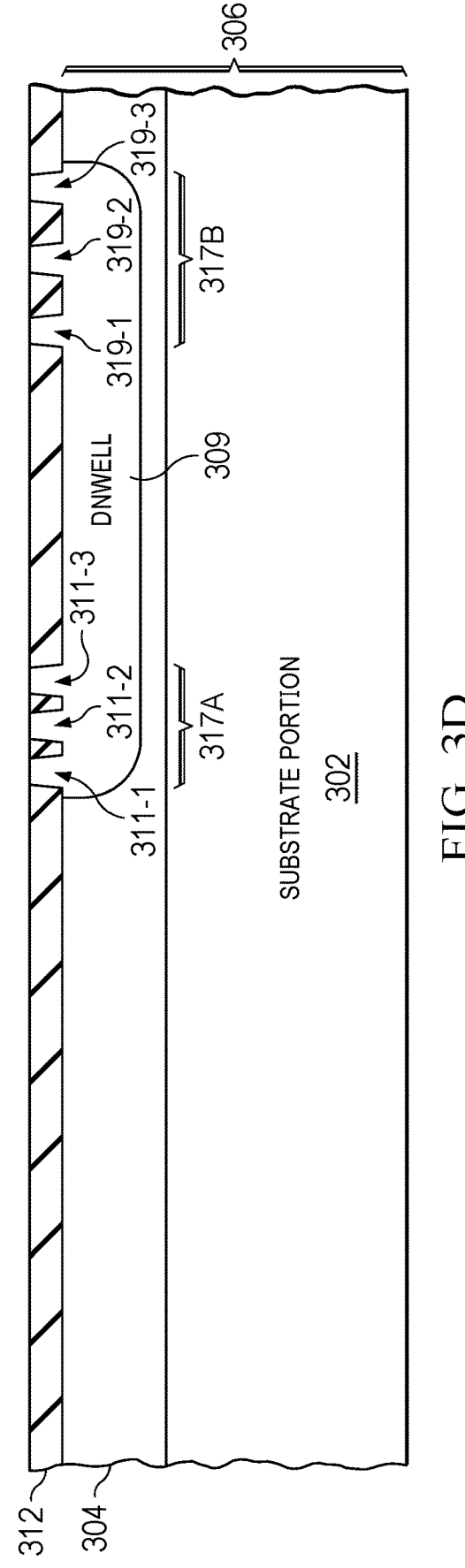
Figure 3E:
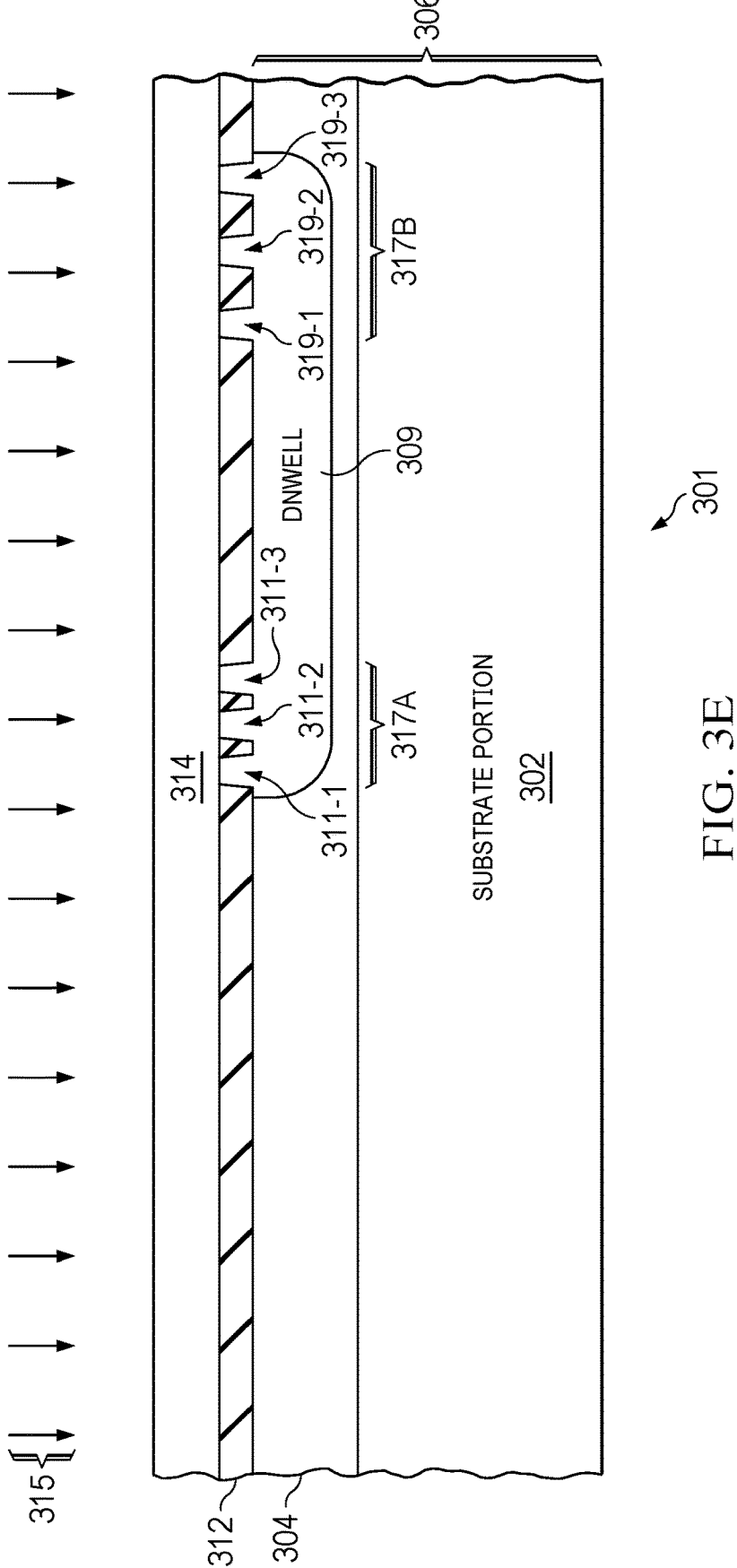

A field dielectric layer 312 (e.g., STI layer) may be formed over the single-crystal layer 304 of the substrate 306 as set forth in FIG. 3D and at block 506. In an example arrangement, the field dielectric layer 312 may comprise field oxide extending into the substrate 306. In some arrangements, STI/dielectric layer 312 may be formed as part of a MOAT definition process before DNWELL implant, as discussed above. Regardless of whether the MOAT isolation is formed before or after the DNWELL formation, field dielectric layer 312 may be polished or planarized using, e.g., a chemical-mechanical polishing (CMP) process (not specifically shown in the Figures depicting cross-sectional views). Thereafter, a polysilicon layer 314 of appropriate thickness is formed over the field dielectric layer 312 as set forth in FIG. 3E and at block 508. In some arrangements, the polysilicon layer 314 may be amorphized or left polycrystalline and may have a thickness of about 20 nm to 100 nm. A resistance-setting p-type implant 315 may be performed (block 508), e.g., as a blanket implant to avoid extra patterning, for forming an implanted resistor body operable as a bias resistor in subsequent process stages. In an example implementation where a resistor with a low/zero TCR is desired, the dopant species of the blanket implant 315 may comprise boron (B) with a dose of $1 \times 10^{15}/cm^2$ to $1 \times 10^{16}/cm^2$ in order to provide a dopant density of $1 \times 10^{20}/cm^3$ to $4 \times 10^{20}/cm^3$. It should be recognized that various dopant dosages and/or concentrations may be provided depending on the desired target resistances taking into account the die area available for forming a bias resistor integrated with a thermistor while minimizing the impact to the overall die area. Further, providing a net doping density that is p-type may advantageously provide more control of the sheet resistance in the bias resistor body than an n-type net doping density in some examples. Additional details relating to forming a low/zero TCR polysilicon-based bias resistor according to some examples may be found in U.S. Pat. No. 8,927,385 and pending TI patent application titled, "ADVANCED POLY RESISTOR AND CMOS TRANSISTOR" (TI Docket No. T100579US01), having U.S. application Ser. No. 17/714,990 (filed Apr. 6, 2022), each incorporated by reference herein in its entirety for all purposes.

In some additional and/or alternative arrangements, the polysilicon layer 314 may be doped in situ rather than by way of a separate implant process, e.g., blanket implant 315, as set forth above. In-situ doping may be implemented as a technique wherein appropriate dopant species may be introduced in a polysilicon layer at the same time the polysilicon layer is being deposited. For example, in situ doping may be implemented using a suitable Si chemical precursor, e.g., silane ($SiH_4$), and a boron-containing precursor, e.g., diborane ($B_2H_6$), along with CVD reactant gases used in polysilicon deposition. In still further arrangements, the polysilicon layer 314 may be doped via diffusion doping at suitable temperatures, wherein a highly doped glass may be grown or deposited that serves as the source of boron that can diffuse into the polysilicon material to achieve a suitable resistance.

Figure 3F:
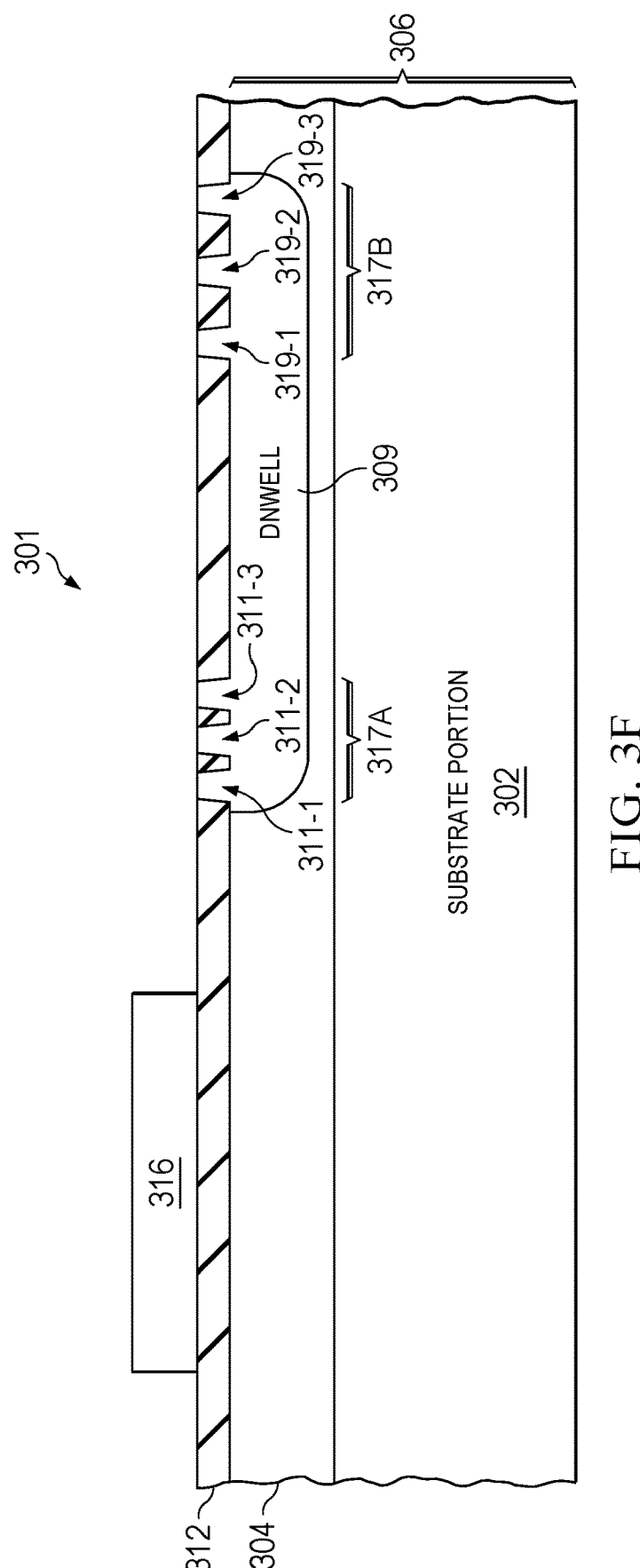

In FIG. 3F, and at block 510, the polysilicon layer 314 may be patterned in a fabrication stage (e.g., involving photolithography and etching, not specifically shown in the Figures) to form a bias resistor body 316 having suitable dimensions over the bias resistor region 310 of the semiconductor device 301. As will be set forth further below, in additional and/or alternative arrangements, the doped bias resistor body 316 may be patterned such that it may form an overlying structure disposed over the STI portion that electrically isolates the underlying DNWELL 309 region, e.g., where the doped bias resistor body 316 has a shape and/or area that does not block the thermistor head regions 317A and 317B and complies with applicable minimum geometry design rules associated therewith.

Figure 3G:
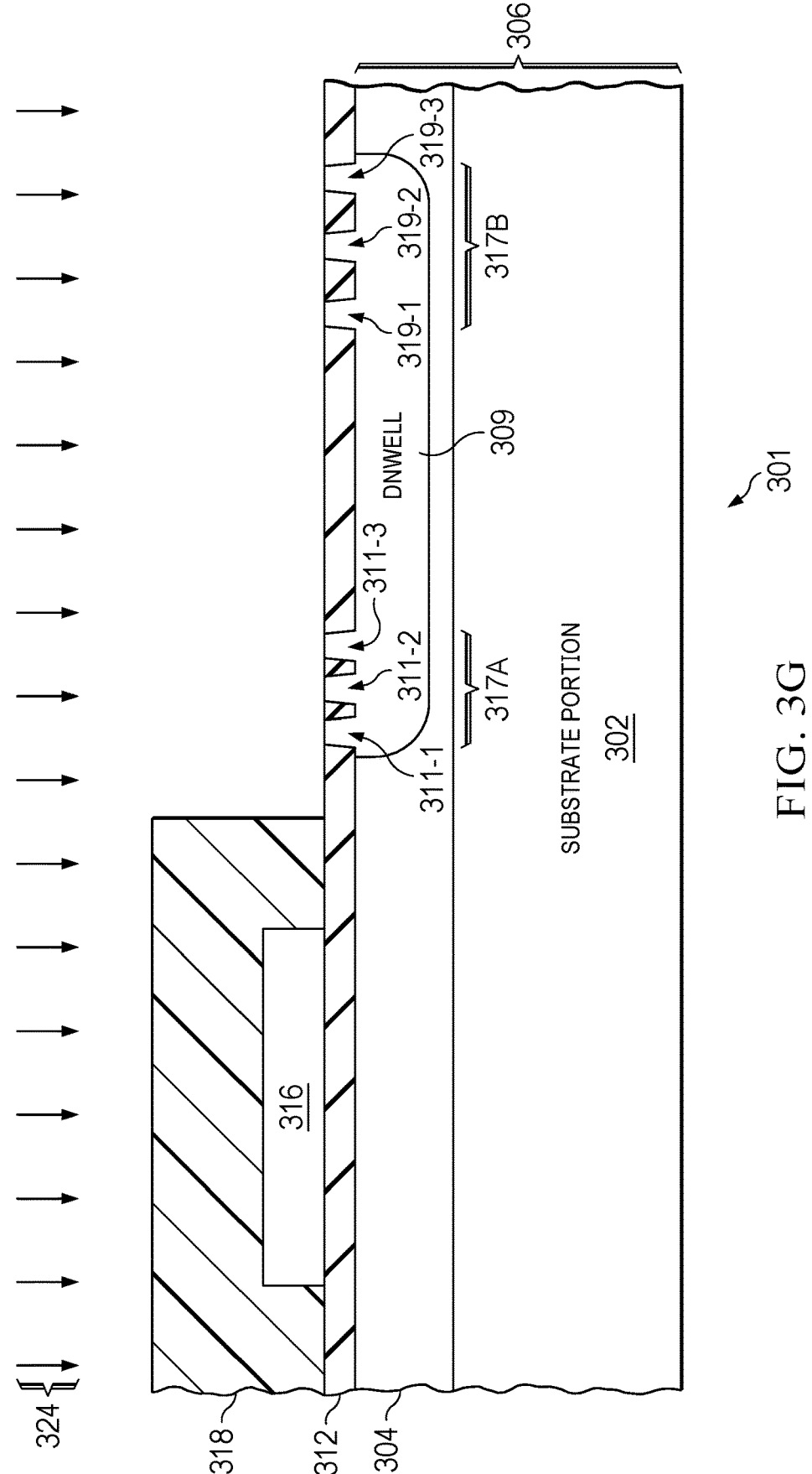

In some arrangements, the contact posts 311-1 to 311-3 and 319-1 to 319-3 formed in the head regions 317A and 317B, respectively, formed in the head regions 317A and 317B may be implanted by an additional n-type dopant as pointed out previously. For example, an implant process 324 illustrated in FIG. 3G and set forth at block 512 may be effectuated so that the respective contact posts 311-1 to 311-3 and 319-1 to 319-3 are adjusted to function as n+ contact posts (e.g., in a process referred to as NSD implant in some implementations), wherein the contact posts have higher n-type dopant concentrations than the surrounding resistor body formed in the n-well. The p-doped bias resistor body 316 may be blocked by a patterned photoresist 318 having a suitable thickness (e.g., operable as an implant block), formed prior to the implant process. It should be appreciated that NSD implant blocking is effective in preventing the n-type dopants from disturbing the properties of the bias resistor body 316 (e.g., by counteracting with the p-type dopants therein) so that the integration of a bias resistor of suitable properties may be facilitated in the same flow used for fabricating a thermistor having another set of properties, e.g., the thermistor formed in DNWELL 309.

Figure 3H:
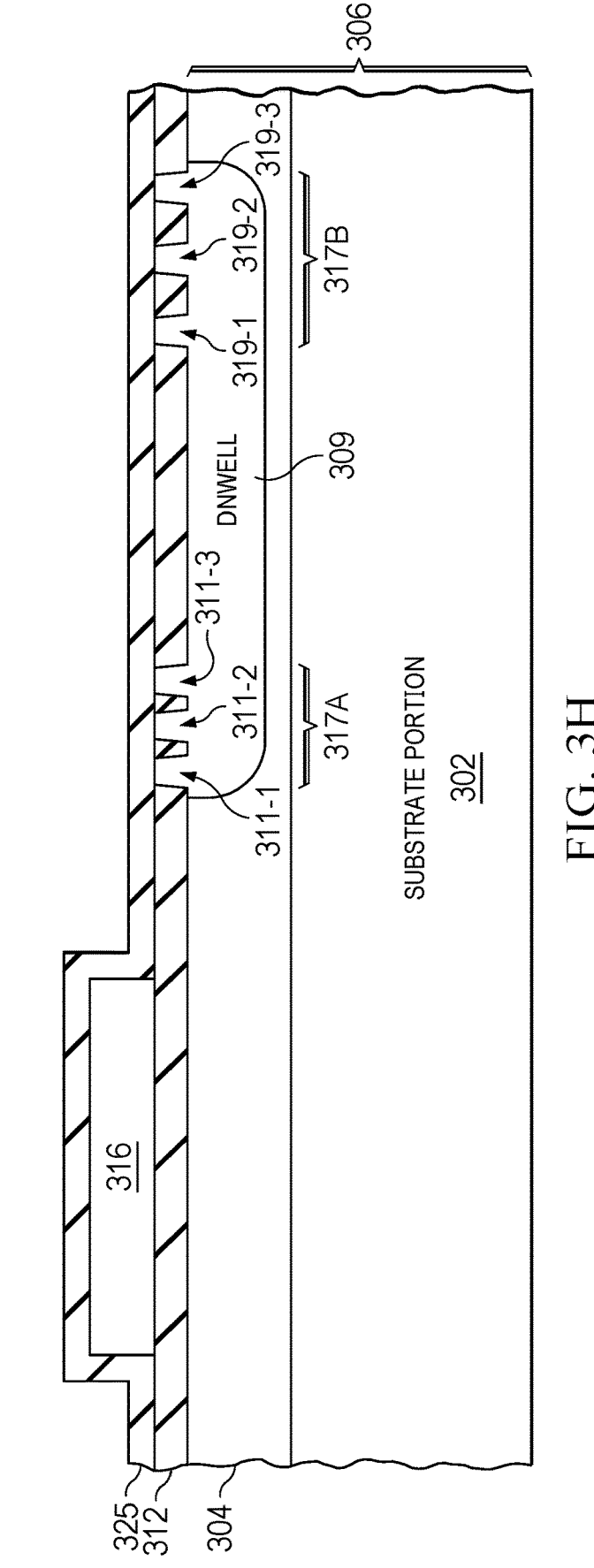

After implanting the contact posts of the respective head regions 317A/317B, a dopant activation anneal process may be effectuated as set forth at block 514 (not specifically shown in the cross-sectional views of fabrication stages). In an example arrangement, the dopant activation anneal process may comprise a rapid thermal anneal (RTA) process at around 1000° C. for about 10 to 15 seconds, which allows the dopants in the thermistor contact posts as well as the poly-based bias resistor body 316 to be activated with minimal risk of significantly altering respective diffusion profiles. Subsequently, a silicide blocking layer (SBL or SiBLK layer) 325 may be formed over the semiconductor device 301 as set forth in FIG. 3H. In an example arrangement, the SiBLK layer 325 may be etched to form a patterned SiBLK structure 328 for defining a plurality of contact holes at respective terminal regions or head regions 331A and 331B of the poly-based bias resistor 316 that remain exposed for subsequent silicidation while the main bias resistor body is blocked from silicidation, as set forth at blocks 516 and 518, and illustratively shown in fabrication stages FIGS. 3I and 3J. As illustrated, an example SiBLK structure 328 may be patterned so as to extend over the head regions 331A/331B and corresponding vertical edges/walls of the bias resistor 316 and onto at least a portion of the field dielectric layer 312. In some additional and/or alternative examples, the semiconductor device 301 may be fabricated such that the SiBLK layer 325 may not have to be formed over the thermistor region 308 because of the coverage provided by the field dielectric layer 312. In some examples, the SiBLK layer 325 may comprise a multi-layer structure including an oxide layer and a layer containing nitride, carbide, SiCN or other suitable material (not specifically shown in the figures). An example oxide layer of the SiBLK layer 325 may be grown or deposited and may have a thickness from 1 nm to 100 nm. An example nitride, carbide, or SiCN layer of the SiBLK layer 325 may be deposited by a (bis-(tertiary butyl amino)-silane) (BTBAS)) process, e.g., at 550° C., or in a plasma enhanced chemical vapor deposition (PECVD) process, e.g., at 350° C. to 400° C., and with a thickness from 5 nm to 40 nm.

Figure 3I:
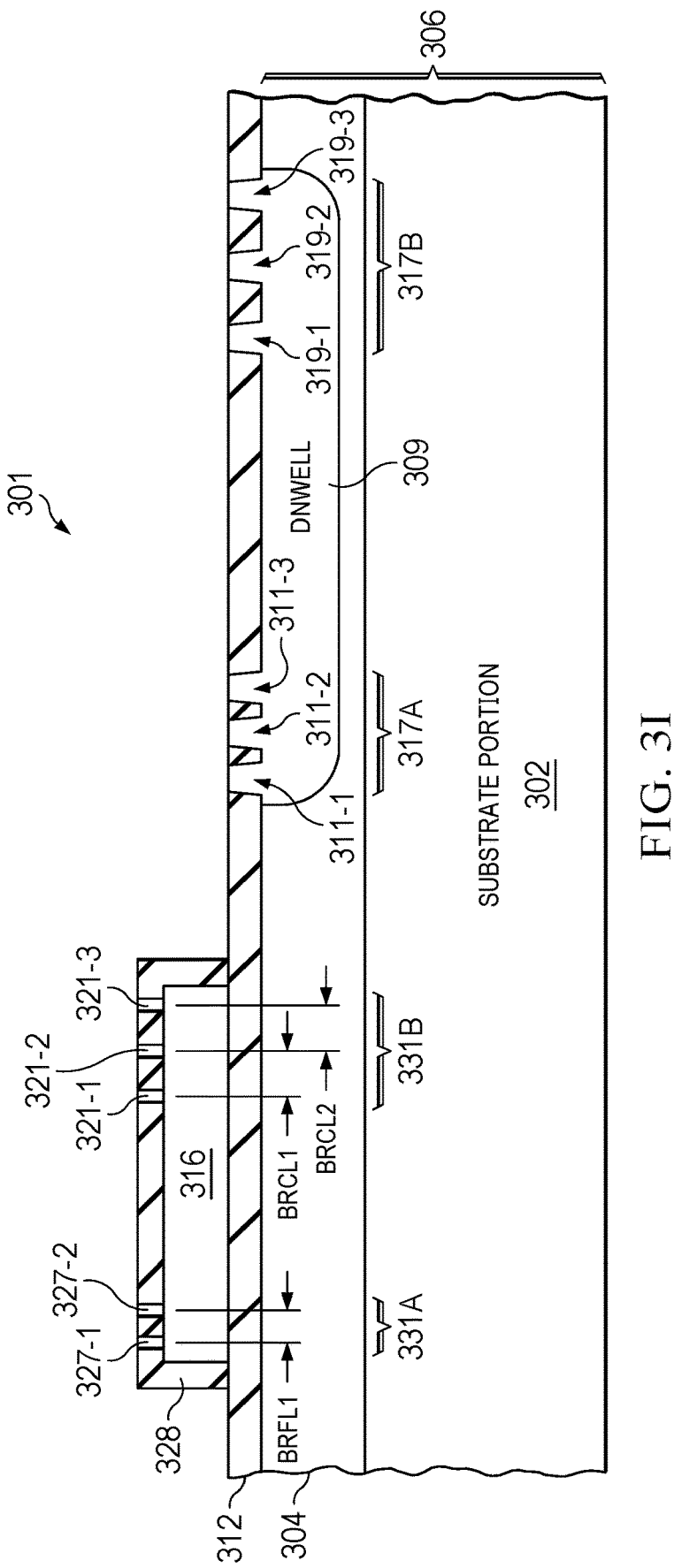
Figure 3J:
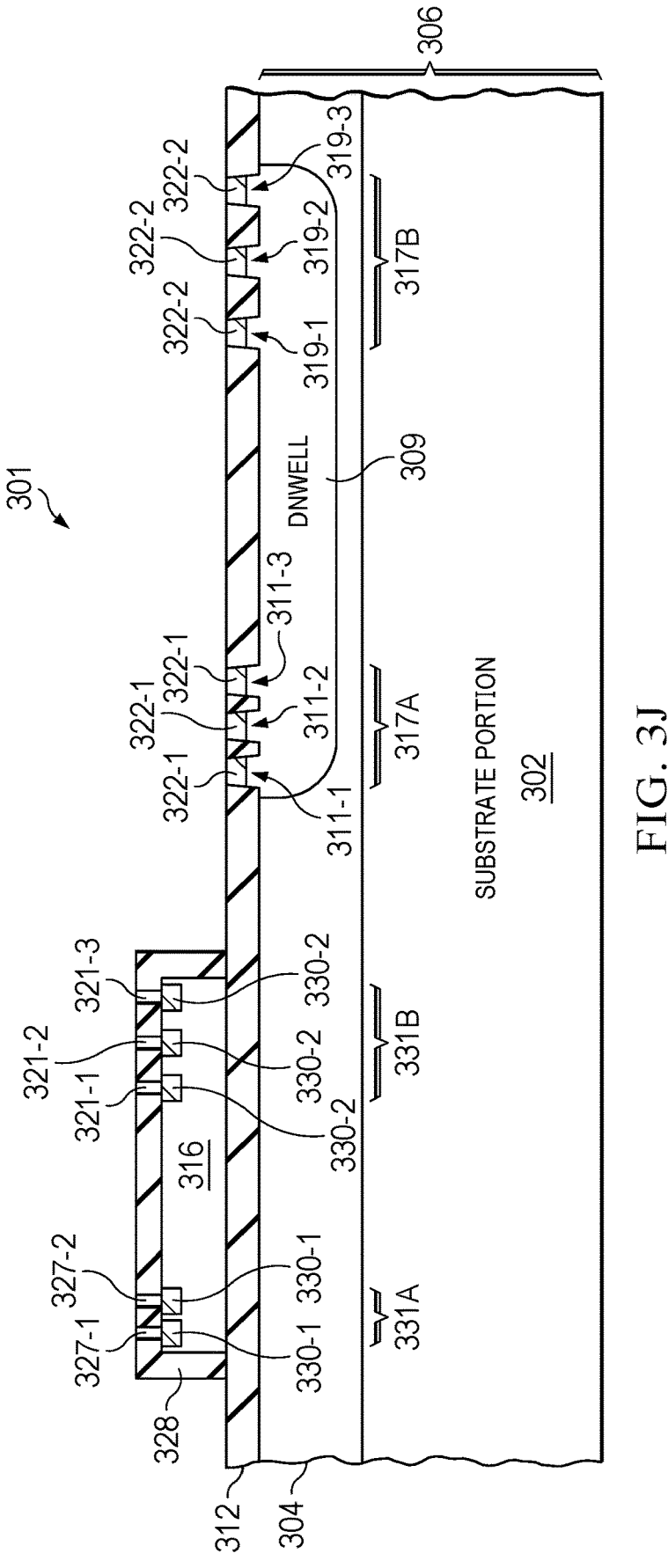

By way of example, patterned SiBLK structure 328 is configured to expose two contact holes 327-1, 327-2 in the head region 331A and three contact holes 321-1 to 321-3 in the head region 331B of the bias resistor body 316, as set forth in the fabrication stage shown in FIG. 3I. It should be appreciated that the pluralities of contact holes/strips formed in the respective head regions 331A and 331B of the bias resistor body 316 may have different spacings for facilitating various combinations of fine- and coarse-tuning operations similar to the thermistor contact posts 319-1 to 319-3 and 311-1 to 311-3 as described above. As illustrated, contact holes 327-1, 327-2 are spaced more closely having a first pitch (e.g., as illustrated by bias resistor fine tuning line (BRFL) 1) than contact holes 321-1 to 321-3 disposed in head region 331B that have wider spacings therebetween, e.g., a second pitch (e.g., as illustrated by bias resistor coarse tuning line (BRCL) 1 and BRCL 2).

After forming and patterning SiBLK structure 328, a silicidation loop may be performed, thereby forming metal-silicide regions on the exposed semiconductor regions of the contact holes of the polysilicon bias resistor body 316 and the contact posts of the thermistor body comprising DNWELL 309. Silicides 330-1 and 330-2 are illustrative of silicidation of the exposed semiconductor regions of the polysilicon bias resistor body 316 in order to effectuate low-resistance connections with an overlying metal layer in a subsequent metallization stage. In similar fashion, silicides 322-1 and 322-2 are illustrative of silicidation of the exposed silicon posts of the thermistor body 309 for effectuating low-resistance connections with the overlying metal layer. In a representative implementation, a silicidation loop may comprise deposition of a metal (e.g., nickel, cobalt, titanium, tungsten, molybdenum, platinum, palladium, tantalum, etc., without limitation), annealing to form silicide (e.g., using heat, ionic energy, laser energy, etc.), followed by the removal of unreacted metal and further annealing to a form low resistivity phase of the silicide material.

Figure 3K:
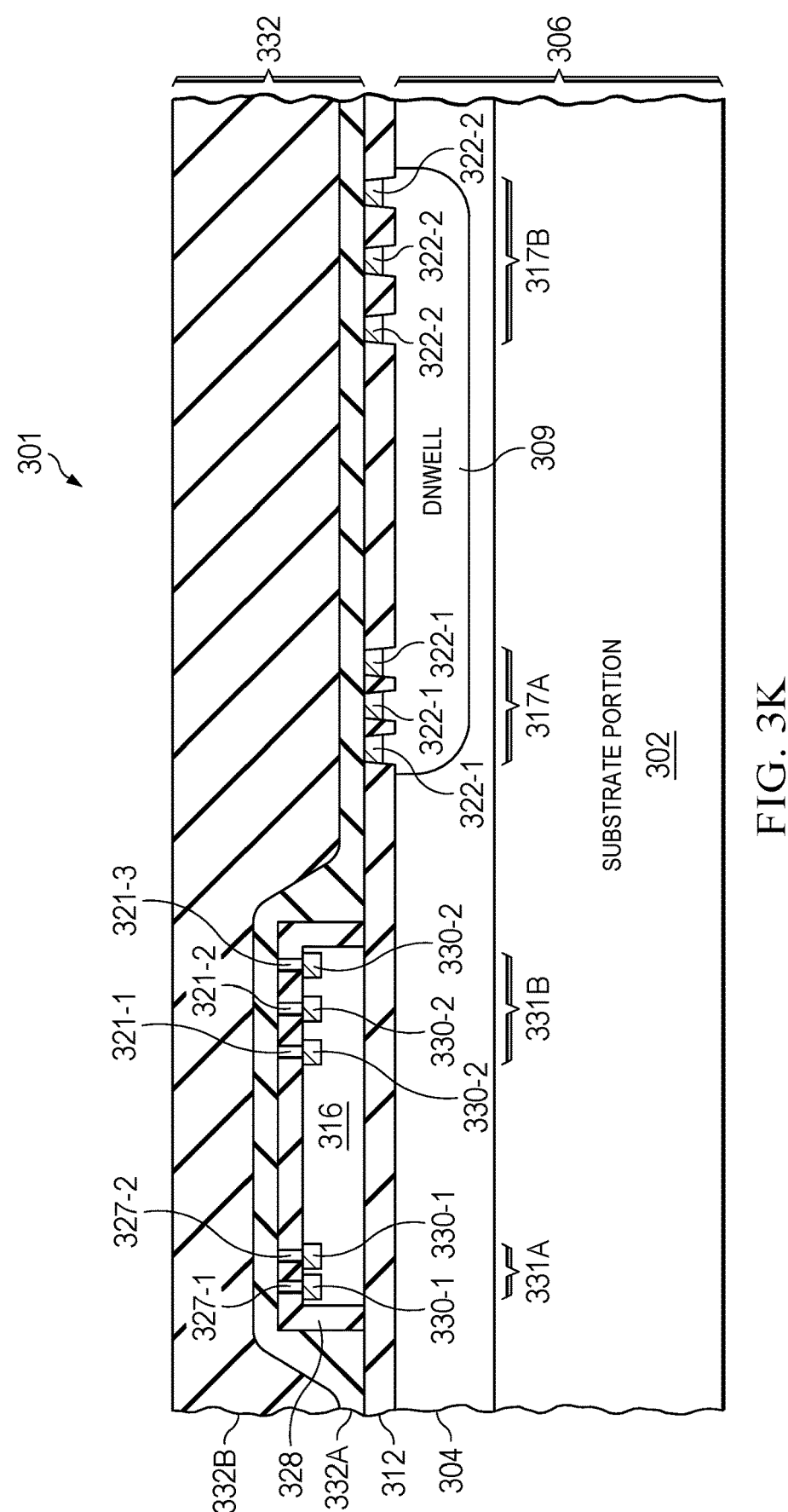

After silicidation of the contact holes and contact posts, a pre-metal dielectric (PMD) stack 332 may be formed over the semiconductor device 301, which may comprise one or more layers and/or liners, e.g., using known or heretofore unknown processes, materials and compositions, as set forth at block 520 and shown in the fabrication stage of FIG. 3K. In an example implementation, a PMD liner 332A comprising SiN may be conformally formed over the SiBLK structure 328, which is then overlaid by a PMD oxide layer 332B, whereupon the overall PMD stack 332 may be planarized using CMP to a suitable thickness. A suitable contact etch process (not specifically shown in this FIG.) may be effectuated to open a plurality of contact vias corresponding to the contact posts associated with the thermistor body 309 and the contact holes associated with the bias resistor body 316 (block 522). Thereafter, the semiconductor device 301 may undergo a contact liner and plug process to fill the contact vias with suitable metal compositions, liners or posts, which may be connected to a patterned metal layer formed over the PMD stack 332 in a metallization process following the opening of pads and metal-based fuse links (not specifically shown in FIGS. 3A-3N) with respect to the thermistor body 309 and the bias resistor body 316. Depending on implementation, the patterned metal layer may comprise a plurality of interconnect lines for facilitating electrical connectivity between the respective resistor heads of the thermistor body 309, bias resistor body 316 as well as the pad terminals formed as part of the semiconductor device 301 via respective fuse links associated therewith.

Figure 3L:
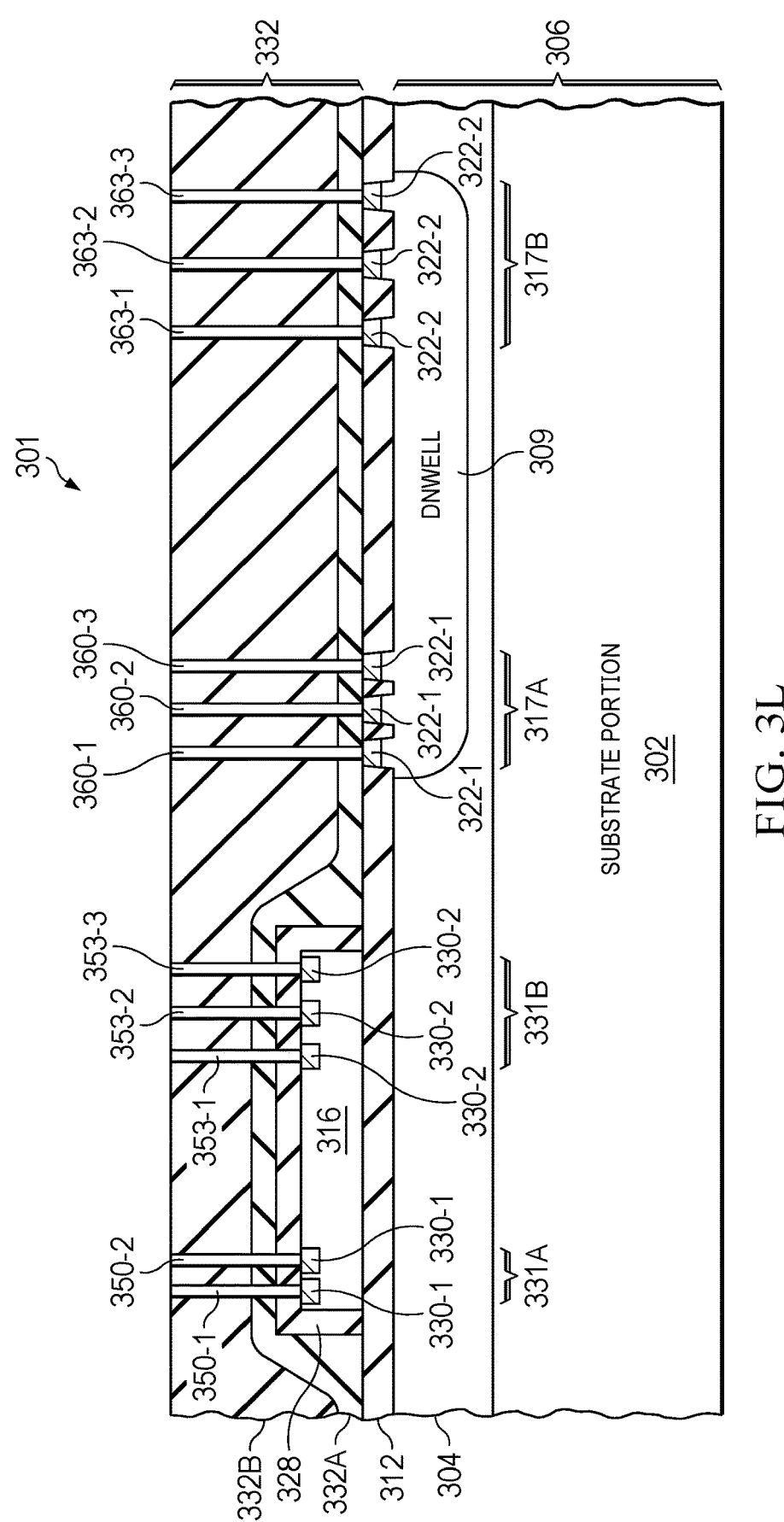

By way of example, a via formation stage set forth in FIG. 3L illustrates a process where contact vias 350-1, 350-2 and contact vias 353-1 to 353-3 are formed (e.g., using an etch process that stops on silicide) with respect to the head regions 331A and 331B, respectively, of the bias resistor body 316. Likewise, contact vias 360-1 to 360-3 and contact vias 363-1 to 363-3 formed (e.g., using an etch process that stops on silicide) with respect to the head regions 317A and 317B, respectively, of the thermistor body 309.

Figure 3M:
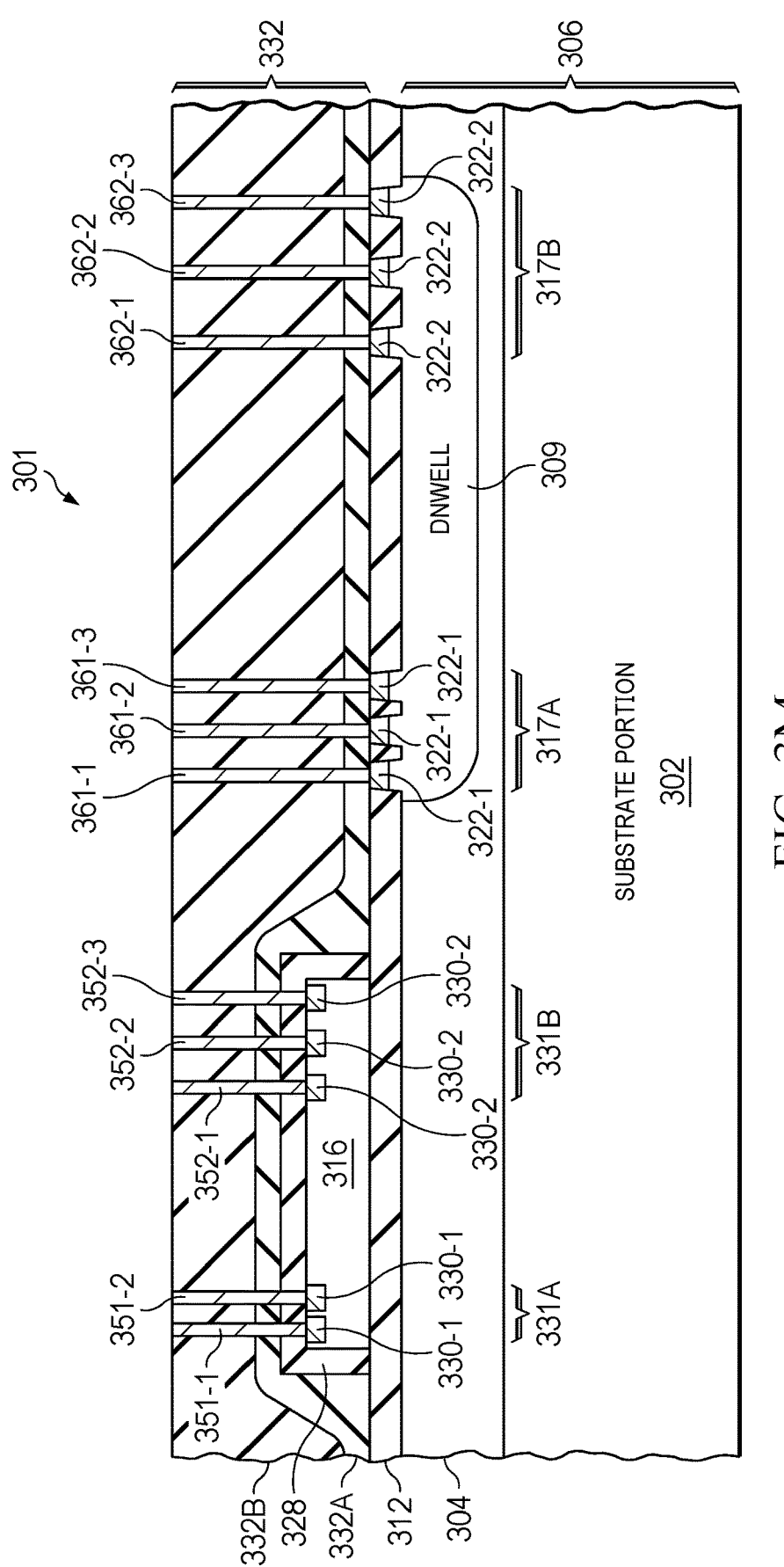
Figure 3N:
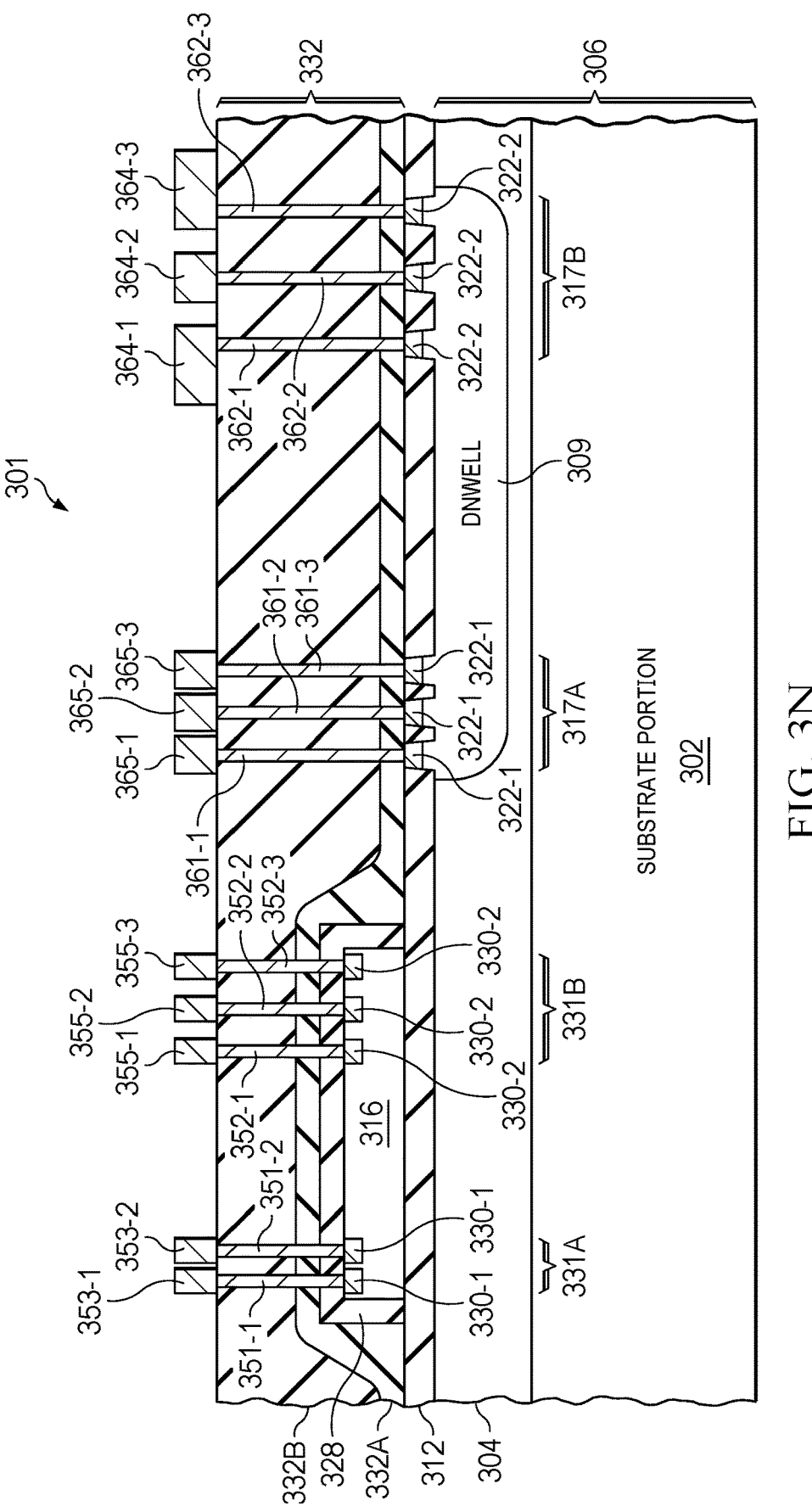

A contact via metallization stage set forth in FIG. 3M, and at block 524, illustrates a process where contact vias may be metallized using a Ti/TiN liner followed by a tungsten (W) filler although other metallurgies may be implemented in additional and/or alternative examples. As illustrated, metallized contact conductors 351-1, 351-2 are formed in contact vias 350-1 and 350-2 and metallized contact conductors 352-1 to 352-3 are formed in contact vias 353-1 to 353-3 associated with the bias resistor body 316. Likewise, metallized contact conductors 361-1 to 361-3 are formed in contact vias 360-1 to 360-3 and metallized contact conductors 362-1 to 362-3 are formed in contact vias 363-1 to 363-3 associated with the thermistor body 309. A polishing process (e.g., a CMP process) may be implemented to remove excess metal formed or left remaining on the planarized surface of the PMD stack 332 (block 524).

A first metallization stage of the backend of line (BEOL) flow may involve depositing, patterning and etching a metallic material (e.g., aluminum, copper, etc.) for forming a metal interconnect layer that interconnects the bias resistor 316, the thermistor body 309 as well the die pads (and any optional ESD protection devices where provided), via respective metal fuse links, which may be configured for tuning (block 526) as previously set forth. Further, respective fuse code settings for achieving appropriate resistances with respect to the bias resistor and/or thermistor may be obtained as will be set forth below. As illustrated in FIG. 3N, reference numbers 353-1 and 353-2 and reference numbers 355-1 to 355-3 refer to metallic traces for interconnecting the head regions 331A, 331B, respectively, of the bias resistor 316. Likewise, reference numbers 365-1 to 365-3 and reference numbers 364-1 to 364-3 refer to metallic traces for interconnecting the head regions 317A, 317B, respectively, of the thermistor body 309.

Continuing to refer to FIG. 5B but without corresponding cross-sectional views, additional steps in manufacturing the semiconductor device 301 are contemplated. For example, in step 528, a semiconductor process wafer including the semiconductor substrate 306 may be coupled to test equipment for resistance measurements, whereupon a suitable set of fuse links may be laser-trimmed based on fuse code determination as set forth below. Thereafter, each die or IC containing the integrated thermistor and the bias resistor is singulated (e.g., cut or diced) from the semiconductor wafer. Thereafter, some or all of the ICs (e.g., those passing additional/optional testing) may be packaged. Packaging typically places a casing around (or encapsulating) the IC and further provides an external interface, typically a number of conductive pins, fixed relative to pads on the die, and conductors such as wire bonds, lands, or balls, etc., are formed between the IC pads and the packaging pins. Thereafter, packaged ICs with acceptable test results are dispositioned for sale and shipping to a customer.

Figure 4A:
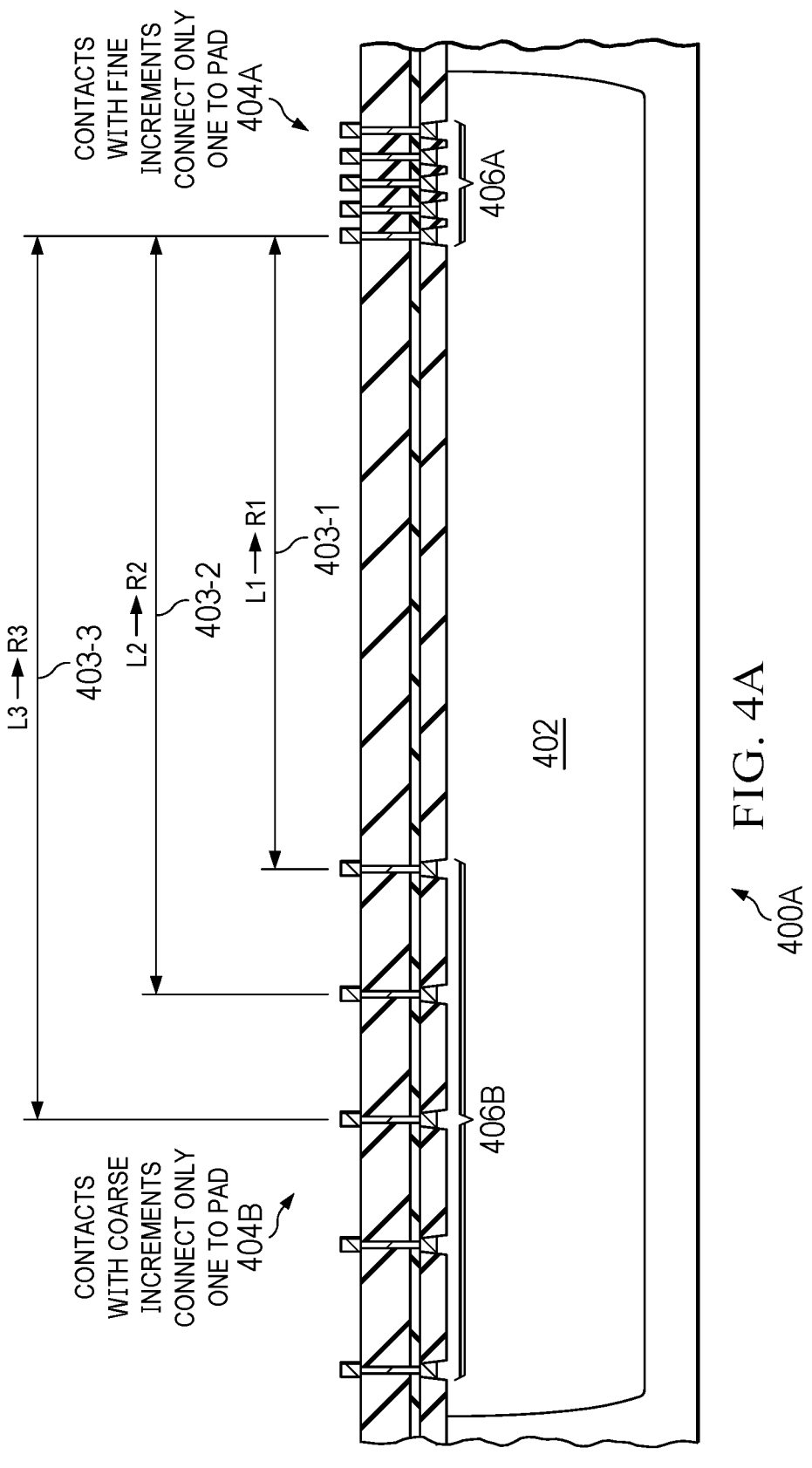
FIGS. 4A and 4B depict example potentiometer schemes for tuning a thermistor and/or a bias resistor based on respective fuse codes to achieve appropriate resistance properties according to some examples.
Figure 4B:
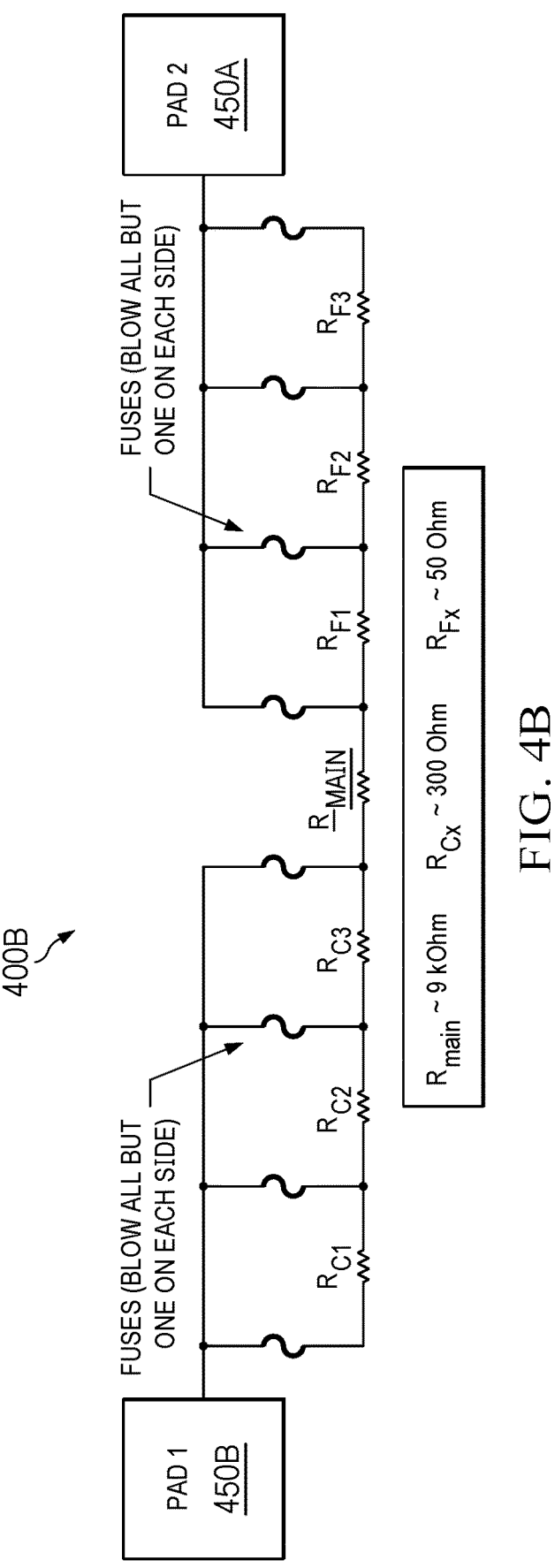

FIGS. 4A and 4B depict a generalized potentiometer scheme for tuning a thermistor and/or a bias resistor based on respective fuse codes to achieve appropriate resistance properties according to some examples, wherein reference number 400A of FIG. 4A generally refers to a resistive component 402 having a resistor body formed as part of an integrated semiconductor structure, e.g., device 301 described above, and reference number 400B of FIG. 4B generally refers to an example circuit schematic corresponding to the resistive component 400A. Example resistive component 402 is provided with a first head region 406A having a plurality of closely placed contacts 404A for facilitating fine-tuning increments of suitable resistance segments, e.g., each having a first unit resistance. Likewise, a second head region 406B is provided with a plurality of widely spaced contacts 404B for facilitating coarse-tuning increments of suitable resistance, e.g., each having a second unit resistance. With respect to each head region of the resistive component 402, only one of the contacts is connected to the corresponding pad based on suitable fuse code that may be determined subsequent to forming the semiconductor structure containing the resistive component 402. Accordingly, various permutations and/or combinations of resistor lengths may be achieved between the two head regions 406A and 406B, e.g., as illustrated by lengths 403-1 to 403-3. In general, if the first and second head regions of a resistive component have N and M contacts, respectively, a total of [N×M] resistor lengths may be available for tuning the final resistance of the resistive component. Further, a resistor length combination resulting in the longest effective inter-head channel length exhibits the highest resistance whereas a resistor length combination with the shortest effective inter-head channel length exhibits the lowest resistance. By way of example, unit resistances ($R_{FX}$) of approximately 50Ω and unit resistances ($R_{CX}$) of approximately 300Ω may be provided for effecting fine-tuning and coarse-tuning adjustments, respectively, wherein a main channel resistance ($R_{MAIN}$) may be doped or otherwise engineered to have a nominal resistance of approximately 9 kΩ, with respect to the resistive component 402 disposed between pads 450A and 450B, as illustrated in FIG. 4B.

In an example implementation of the binary ladder potentiometer architecture set forth above, the unit resistors may be provided as identical structures disposed at the respective head regions in order to ensure good matching and predictability of the properties. By using fuses to determine which legs are opened and which legs remain shorted, the resistance can be adjusted between the two end cases as set forth above. In some examples, a plurality of metal laser fuse links may be laid out in the metal layer and a post-metallization process may be implemented to program a specific fuse pattern (e.g., a fuse code) for achieving a target resistance based on appropriate trimming. For example, after a protective overcoat (PO) deposition, a pattern may be etched to open the probe pads and to uncover the fuses. The resistance may be measured using a prober that may be configured to allow for temperature correction, e.g., with respect to a thermistor tuning. Using the measured resistance, a trim algorithm may be implemented to determine which fuses to open (e.g., according to the fuse code) to attain the desired resistance target. After the resistance measurement, an oxide film may deposited to cover the pads and unselected fuses and a laser trim tool may be used to expose the selected fuses, which damages the oxide layer and locally melts the exposed metal. A wet "slag" etch may then be performed to chemically remove metal that may remain where the fuses are intended to be open. A final PO SiON layer may be deposited and etched to open the pads while leaving the fuses covered.

Figure 6:
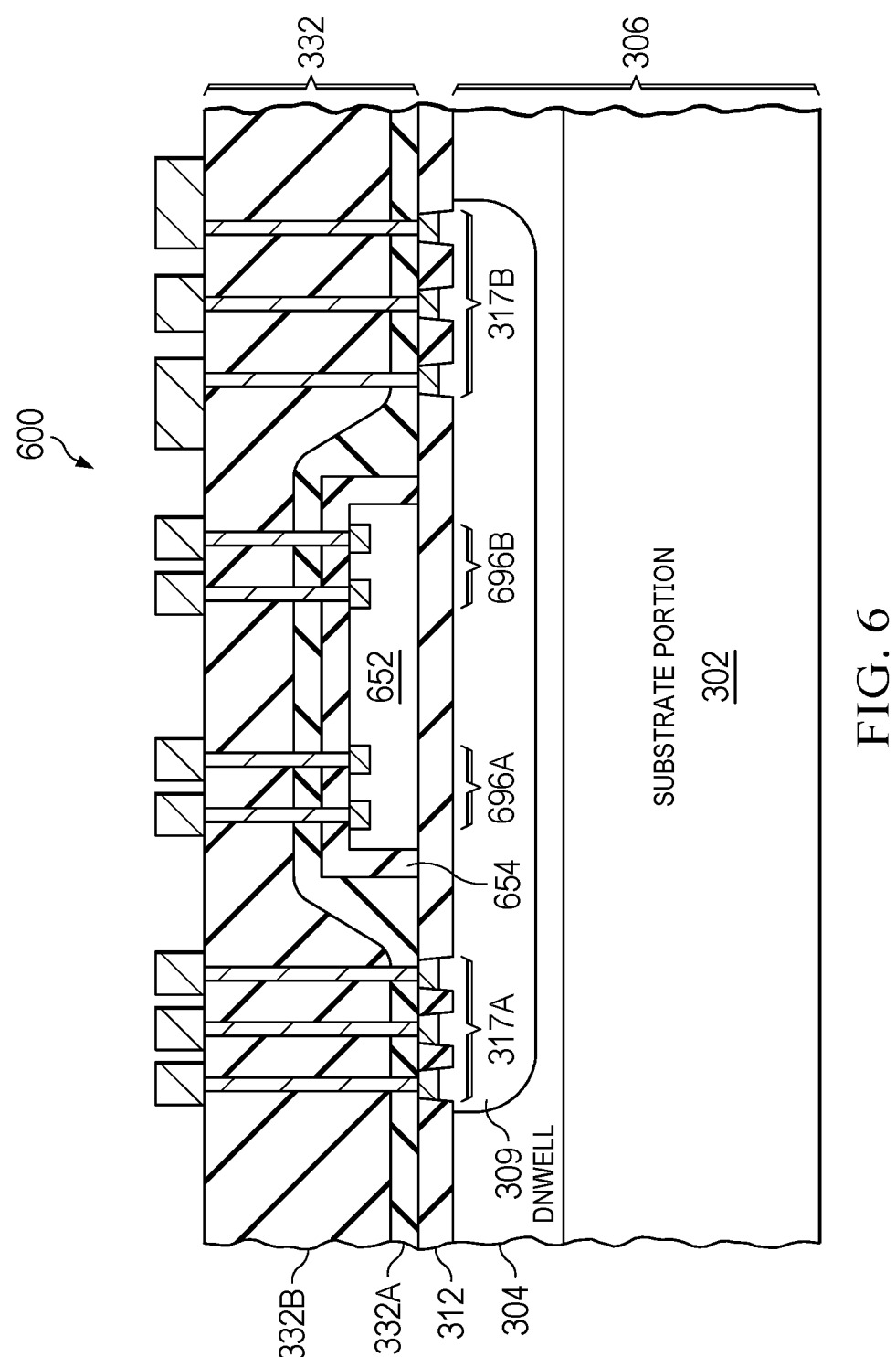
FIG. 6 depicts a cross-sectional view of an electronic device where an integrated thermistor and bias resistor are vertically oriented relative to each other according to another example of the present disclosure.

FIG. 6 depicts a cross-sectional view of a semiconductor IC device 600 where an integrated thermistor and bias resistor are vertically oriented relative to each other (e.g., in a stack arrangement) according to another example of the present disclosure. It will be appreciated that a vertically oriented voltage divider may be formed in a process flow set forth above wherein the patterning of a doped polysilicon layer set forth in FIG. 3F may be modified in order to form a bias resistor body 652 that is disposed over the STI portion isolating the thermistor body in the DNWELL 309. In similar fashion, the patterning of a SiBLK structure 654 overlying the bias resistor body 652 as well as remaining processing stages may also be modified in a corresponding manner, mutatis mutandis, e.g., for forming silicided contacts in resistor head regions 696A/696B, respectively, consistent with the foregoing description.

Based on the foregoing, it should be appreciated that examples of the present disclosure provide an integrated thermistor and a bias reference resistor on a single die, thereby obviating the need to procure two discrete components, potentially from separate manufacturers, for a product application. Because the voltage divider circuit according to the examples herein is formed as an integrated component rather than two separate devices, circuit board space—and cost—may be minimized, which may allow product miniaturization in an application, e.g., in a sensor application. Die size savings may be particularly significant especially in a vertically oriented thermistor-bias resistor configuration. Further, whereas conventional bias reference resistors are fabricated in process flows requiring tighter process controls in order to achieve required precision, which thwarts integration of the device in an IC having other components that are typically manufactured in less stringent flows (and relatively simpler flows having only a small number of mask layers) such as, e.g., thermistor flows, examples herein provide an integrated process flow that can advantageously accommodate the fabrication of a low/zero TCR component, e.g., a bias resistor, in a flow including the thermistor flow wherein the bias resistor can be fine-tuned to meet the specifications of a particular application. Whereas example arrangements set forth herein may therefore be expected to provide a combination of various tangible improvements, no particular result is a requirement unless explicitly recited in a particular claim.

While various examples of the present disclosure have been described above, it should be understood that they have been presented by way of example only and not limitation. Numerous changes to the disclosed examples can be made in accordance with the disclosure herein without departing from the spirit or scope of the disclosure. Thus, the breadth and scope of the present disclosure should not be limited by any of the above described examples. Rather, the scope of the disclosure should be defined in accordance with the claims appended hereto and their equivalents.

For example, in this disclosure and the claims that follow, unless stated otherwise and/or specified to the contrary, any one or more of the layers set forth herein can be formed in any number of suitable ways, such as with spin-on techniques, sputtering techniques (e.g., Magnetron and/or ion beam sputtering), (thermal) growth techniques or deposition techniques such as chemical vapor deposition (CVD), physical vapor deposition (PVD), PECVD, or atomic layer deposition (ALD), etc. As another example, silicon nitride may be a silicon-rich silicon nitride or an oxygen-rich silicon nitride. Silicon nitride may contain some oxygen, but not so much that the materials dielectric constant is substantially different from that of high purity silicon nitride.

Further, in at least some additional or alternative implementations, the functions/acts described in the blocks may occur out of the order shown in the flowcharts. For example, two blocks shown in succession may in fact be executed substantially concurrently or the blocks may sometimes be executed in the reverse order, depending upon the functionality/acts involved. Moreover, the functionality of a given block of the flowcharts and/or block diagrams may be separated into multiple blocks and/or the functionality of two or more blocks of the flowcharts and/or block diagrams may be at least partially integrated. Also, some blocks in the flowcharts may be optionally omitted. Furthermore, although some of the diagrams include arrows on communication paths to show a primary direction of communication, it is to be understood that communication may occur in the opposite direction relative to the depicted arrows. Finally, other blocks may be added/inserted between the blocks that are illustrated.

It should therefore be clearly understood that the order or sequence of the acts, steps, functions, components or blocks illustrated in any of the flowcharts and/or block diagrams depicted in the drawing Figures of the present disclosure may be modified, altered, replaced, customized or otherwise rearranged within a particular flowchart or block diagram, including deletion or omission of a particular act, step, function, component or block. Moreover, the acts, steps, functions, components or blocks illustrated in a particular flowchart may be inter-mixed or otherwise inter-arranged or rearranged with the acts, steps, functions, components or blocks illustrated in another flowchart in order to effectuate additional variations, modifications and configurations with respect to one or more processes for purposes of practicing the teachings of the present disclosure.

At least some portions of the foregoing description may include certain directional terminology, such as, e.g., "upper", "lower", "top", "bottom", "left-hand", "right-hand", "front side", "backside", "vertical", "horizontal", etc., which may be used with reference to the orientation of some of the Figures or illustrative elements thereof being described. Because components of some examples can be positioned in a number of different orientations, the directional terminology is used for purposes of illustration and is in no way limiting. Likewise, references to features referred to as "first", "second", etc., are not indicative of any specific order, importance, and the like, and such references may be interchanged mutatis mutandis, depending on the context, implementation, etc. Further, the features of examples described herein may be combined with each other unless specifically noted otherwise.

Although various implementations have been shown and described in detail, the claims are not limited to any particular implementation or example. None of the above Detailed Description should be read as implying that any particular component, element, step, act, or function is essential such that it must be included in the scope of the claims. Where the phrases such as "at least one of A and B" or phrases of similar import are recited or described, such a phrase should be understood to mean "only A, only B, or both A and B." Reference to an element in the singular is not intended to mean "one and only one" unless explicitly so stated, but rather "one or more." All structural and functional equivalents to the elements of the above-described implementations that are known to those of ordinary skill in the art are expressly incorporated herein by reference and are intended to be encompassed by the claims appended below.

What is claimed is:

1. An electronic device, comprising:
a substrate including an n-well region;
a thermistor formed in the n-well region; and
a bias resistor connected in series to the thermistor, the bias resistor formed in a region of the substrate isolated from the n-well region.

2. The electronic device as recited in claim 1, wherein the thermistor comprises a well resistor in the n-well region having a dopant species comprising at least one of phosphorous and arsenic.

3. The electronic device as recited in claim 1, wherein the bias resistor comprises a boron-doped polysilicon structure disposed over field oxide extending into the substrate.

4. The electronic device as recited in claim 1, further comprising a first plurality of fuses for tuning the thermistor and a second plurality of fuses for tuning the bias resistor.

5. The electronic device as recited in claim 4, wherein the first plurality of fuses for tuning the thermistor comprises a first subset of fuses spaced apart with a first pitch coupled to a first terminal of the thermistor and a second subset of fuses spaced apart with a second pitch greater than the first pitch and coupled to a second terminal of the thermistor.

6. The electronic device as recited in claim 4, wherein the second plurality of fuses for tuning the bias resistor comprises a first subset of fuses spaced apart with a first pitch coupled to a first terminal of the bias resistor and a second subset of fuses spaced apart with a second pitch greater than the first pitch and coupled to a second terminal of the bias resistor.

7. The electronic device as recited in claim 1, wherein the thermistor has a positive temperature coefficient.

8. The electronic device as recited in claim 1, wherein the thermistor has a negative temperature coefficient.

9. The electronic device as recited in claim 1, wherein the n-well region extends into an epitaxial layer of the substrate.

10. The electronic device as recited in claim 1, wherein the bias resistor and the thermistor are disposed relative to each other in a stack having a dielectric layer formed therebetween.

11. A method of fabricating an electronic device, comprising:
forming voltage divider over a semiconductor substrate, including:
forming a thermistor in an n-well region extending into the semiconductor substrate;
forming a bias resistor over a region of the semiconductor substrate conductively isolated from the n-well region; and
connecting the thermistor and the bias resistor in series between a first reference voltage rail of the electronic device and a second reference voltage rail of the electronic device.

12. The method as recited in claim 11, wherein the thermistor comprises a well resistor in the n-well region having a dopant species comprising at least one of phosphorous and arsenic.

13. The method as recited in claim 11, wherein the bias resistor comprises a boron-doped polysilicon structure disposed over a field oxide extending into the semiconductor substrate.

14. The method as recited in claim 11, further comprising forming a first plurality of fuses over the semiconductor substrate for tuning the thermistor and a second plurality of fuses for tuning the bias resistor.

15. An integrated circuit, comprising:

a semiconductor substrate die;

a field dielectric layer on the substrate die;

an n-well region in the substrate die;

a first resistor including a polysilicon body formed on the field dielectric layer;

a second resistor formed in the n-well region; and conductive interconnections that connect the first resistor and the second resistor in series between a first terminal and a second terminal.

16. The integrated circuit as recited in claim 15, further comprising a third terminal connected to a conductive circuit node between the first and second resistors.

17. The integrated circuit as recited in claim 16, further comprising a first fuse bank connected in a circuit path between the third terminal and the first resistor and a second fuse bank connected in a circuit path between the third terminal and the second resistor.

18. The integrated circuit as recited in claim 17, further comprising a third fuse bank connected in a circuit path between the first terminal and the first resistor and a fourth fuse bank connected in a circuit path between the second terminal and the second resistor.

19. The integrated circuit as recited in claim 15, wherein the first resistor has a first temperature coefficient of resistance (TCR) and the second resistor has a lesser second TCR.

20. The integrated circuit as recited in claim 19 wherein the second TCR is in a range of ±100 ppm/° C.

\* \* \* \* \*